United States Patent [19]
Uchida et al.

[11] Patent Number: 6,043,104
[45] Date of Patent: Mar. 28, 2000

[54] FABRICATION METHOD OF A POLARIZATION SELECTIVE SEMICONDUCTOR LASER

[75] Inventors: Mamoru Uchida, Yokohama; Makoto Ogusu, Utsunomiya, both of Japan

[73] Assignee: Canon Kabushiki Kaisha, Tokyo, Japan

[21] Appl. No.: 09/339,539

[22] Filed: Jun. 24, 1999

Related U.S. Application Data

[62] Division of application No. 08/917,700, Aug. 26, 1997.

[30]  Foreign Application Priority Data

Aug. 28, 1996  [JP]  Japan ................................... 8-245740
Aug. 30, 1996  [JP]  Japan ................................... 8-248702

[51] Int. Cl.[7] .................................................. H01L 21/00
[52] U.S. Cl. ............................... 438/32; 438/31; 438/47; 372/50; 257/94
[58] Field of Search ............................. 372/50; 438/31, 438/32, 47

[56]  References Cited

U.S. PATENT DOCUMENTS

| | | | |
|---|---|---|---|
| 5,249,244 | 9/1993 | Uchida | 385/15 |
| 5,586,131 | 12/1996 | Ono et al. | 372/27 |
| 5,699,373 | 12/1997 | Uchida et al. | 372/27 |
| 5,757,832 | 5/1998 | Uchida | 372/45 |
| 5,822,352 | 10/1998 | Mizutani et al. | 372/50 |
| 5,841,799 | 11/1998 | Hiroki | 372/19 |
| 5,901,166 | 5/1999 | Nitta et al. | 372/50 |

FOREIGN PATENT DOCUMENTS 7-235718  9/1995  Japan .

*Primary Examiner*—Donald L. Monin, Jr.
*Assistant Examiner*—Douglas A. Willie
*Attorney, Agent, or Firm*—Fitzpatrick, Cella, Harper & Scinto

[57]  ABSTRACT

A fabrication method of a semiconductor laser capable of controlling a polarization mode of output light is disclosed. In the fabrication method, after two laser portions are independently formed, the laser portions are positioned to be optically coupled to each other. In another fabrication method of the laser, after at least portions of two laser portions are separately formed, an irregularly-formed portion at a boundary portion therebetween is removed. The fabrication method can be facilitated and a degree of freedom in the polarization control can be increased, since the two laser portions are separately formed.

11 Claims, 30 Drawing Sheets

ELECTRODE

OSCILLATION AREA

FABRICATION METHOD OF A POLARIZATION SELECTIVE SEMICONDUCTOR LASER

This is a divisional application of application Ser. No. 08/917,700, filed Aug. 26, 1997.

BACKGROUND OF THE INVENTION

1. Field of the Invention

The present invention relates to a semiconductor laser. In particular, the present invention relates to a semiconductor laser whose polarization mode of output light is switchable. Further, the present invention relates to a semiconductor laser array including a plurality of lasers, an optical transmitter using the semiconductor laser, an optical communication system using the semiconductor laser and a fabrication method of the semiconductor laser.

2. Related Background Art

In recent years, optical communication technologies using optical devices, such as a semiconductor laser, have solved a number of problems. However, a problem of so-called chirping has not yet been solved. The chirping is a phenomenon that the waveform of output light from a semiconductor laser is distorted by fluctuation in a refractive index due to carriers' uneven distribution caused at the time of a high-speed intensity modulation of the semiconductor laser. A primary method for solving the chirping, which is presently employed, is an external modulation method in which a semiconductor laser is driven in a CW (continuous wave) manner and its output light is intensity-modulated by an external semiconductor optical modulator. Recent studies, however, revealed that there;is still a limitation to reduction of the chirping obtained by that external modulation method.

In contrast therewith, in a polarization selective or switchable laser for switching its polarization plane of laser light in accordance with a signal, the chirping is small and its modulation speed and transmission distance can be improved, compared with an ordinary intensity-modulation laser, since it is possible for the polarization selective laser to keep the light density and the carrier density in its cavity almost constant even during its modulation time. With respect to the polarization selective laser, Japanese Patent Publication No. 5-68111 and Japanese Patent Laid-Open Application No. 7-235718 disclose semiconductor laser apparatuses, respectively. In the semiconductor laser apparatus, there are arranged two semiconductor lasers connected serially or in parallel, and one of them chiefly generates or amplifies light in a predetermined polarization state (a transverse electric (TE) mode or a transverse magnetic (TM) mode) while the other chiefly generates or amplifies light in another polarization state (the TE mode or the TM mode). Further, light waves generated or amplified by one semiconductor laser can be superimposed on light waves generated or amplified by the other.

FIG. 30 illustrates the schematic structure of a conventional semiconductor laser apparatus. The semiconductor laser apparatus is comprised of two different semiconductor lasers connected serially. Its first semiconductor laser includes a gain region 1103a in which a gain for the TE mode always exceeds a gain for the TM mode, its second semiconductor laser includes a gain region 1103b which has gain characteristics opposite to those of the first semiconductor laser, and the respective semiconductor lasers have distributed reflectors 1107a and 1107b, such as gratings or the like whose Bragg wavelengths are respectively set close to peak wavelengths of gain spectra of the first and second semiconductor lasers. Its operation principle is as follows: Carriers are independently injected into the first and second semiconductor lasers, and the gains for the TE mode and the TM mode are brought to their equal threshold gain. With using this state as a bias point, the polarization switching between the TE mode and the TM mode is conducted by slightly modulating carriers injected into at least one of the two semiconductor lasers. Compared with an ordinary intensity-modulation laser, the polarization selective or switchable laser is said to be superior thereto in that the chirping is small and its modulation speed and transmission distance can be improved since it is possible for the polarization selective laser to keep the light density and the carrier density in its cavity almost constant even during its modulation time, as mentioned above. In FIG. 30, reference numeral 1101 denotes a substrate. Reference numeral 1102 denotes a lower clad layer. Reference numeral 1104 denotes a light guide layer. Reference numeral 1105 denotes an upper clad layer. Reference numeral 1106 denotes a contact layer. Reference numerals 1109a, 1109b and 1110 respectively denote electrodes. Reference numeral 1111 denotes an antireflection layer provided on an end facet of the device.

SUMMARY OF THE INVENTION

With respect to a specific fabrication method of the above semiconductor laser apparatus, though almost no method has been proposed so far, the inventor of this application studied the following methods, taking into account conventional fabrication methods of other devices.

(1) A method of fabricating TE-mode and TM-mode semiconductor laser regions using two selective growth steps, respectively.

(2) A method of fabricating TE-mode and TM-mode semiconductor laser regions using two growth steps without any selective masks and two selective etchings.

(3) A method of fabricating TE-mode and TM-mode semiconductor laser regions during a single growth step using the area-dependency of a region of a selective mask.

However, the above conventional devices and the fabrication methods studied by the inventor of this application respectively have the following technical disadvantages.

(1) In the conventional devices, no means for controlling the wavelength fluctuation during the high-speed modulation time is provided therein, so that there is a limitation to its transmission capacity and those devices are unsuitable for light sources for wavelength division multiplexing communications.

(2) There has been proposed no specific design scheme and no fabrication method for two kinds of semiconductor lasers having different polarization planes. As an example of the fabrication method, a method can be considered, in which two semiconductor lasers are formed on a common substrate by using a selective growth method using a MOCVD method or the like. However, it is very difficult to optimize those semiconductor lasers independently. For example, in the first method mentioned above, abnormal growth is likely to occur at the edge of the selective mask, and it is very hard in the second growth step to obtain the same controllability and crystalline quality as those of the first growth step. In the second method mentioned above, the controllability of the selective etching is somewhat poor, and abnormal growth is likely to occur at a boundary portion, leading to a decrease in yield of the device fabrication. In the third method mentioned above, though a problem in its fabrication is small, there is a limitation to the structure of a producible device, and it is impossible to optimize the device. At any rate, there is at present no method that can produce the polarization selective laser with a good reliability.

(3) A polarization switchable range is narrow. Although two semiconductor lasers constituting the entire device are respectively distributed feedback (DFB) lasers, such a laser is not a simple DFB laser when a composite cavity structure is built. For one laser, the other laser functions as a distributed Bragg reflector (DBR) at one time and functions as a Fabry-Perot cavity at the other time. Therefore, its phase condition is different from that at the time of a single DFB laser, and not simple. As a result, if those two semiconductor lasers are optically coupled to each other in a simple manner, its polarization switchable operation range tends to be extremely narrow.

(4) A fabrication method for achieving an array is hard to establish. It is indispensable to build an array of semiconductor lasers for use in optical communications, especially, optical interconnection and wavelength multiplexing communications, but it is very difficult to arrange the semiconductor lasers in an array. Therefore, in the conventional methods, no method for achieving the array is considered at all. Particularly, it becomes harder to equalize the gain peak wavelength and the Bragg wavelength with each other as the number of lasers in an array increases.

In the present invention to be described later, the problems in the structure and fabrication of the conventional polarization selective semiconductor lasers are solved, a wavelength control for obtaining the wavelength stability is performed by using semiconductor laser structures for the TE mode and the TM mode, which can be optimized substantially independently, and a relatively-low cost semiconductor laser with a wide polarization switchable or modulation operation range, its fabrication method and an apparatus, a system and the like using the semiconductor laser can be realized.

FIG. 1 schematically shows the principle of a typical example of the present invention. In FIG. 1, reference numeral 1 designates a first semiconductor laser structure, reference numeral 2 designates a second semiconductor laser structure, reference numeral 3 designates a spacing formed between the laser structures 1 and 2 and/or a filler, and reference numeral 4 denotes a heat sink. When the semiconductor laser structures 1 and 2 are respectively operated in a single form, the TM mode (or the TE mode) is stimulated by a first cavity 7 and the TE mode (or the TM mode) is stimulated by a second cavity 8. In contrast, when those laser structures 1 and 2 are optically coupled to each other, both the TE mode and the TM mode are stimulated by a composite structure which includes not only the first and second cavities but a third cavity 9. For that purpose, it is necessary that the TM mode of the first semiconductor laser structure 1 is coupled to the TM mode of the second semiconductor laser structure 2 and that the TE mode of the second semiconductor laser structure 2 is coupled to the TE mode of the first semiconductor laser structure 1. This requires that propagation constants for the TE mode of the first semiconductor laser structure 1 and the second semiconductor laser structure 2 are approximately equal to each other and that propagation constants for the TM mode of the first semiconductor laser structure 1 and the second semiconductor laser structure 2 are approximately equal to each other. To satisfy those requirements is not technically difficult.

An important point of the present invention is that threshold gains for the TE mode and the TM mode permitted by the composite cavity comprised of the first, second and third cavities can be made approximately equal by controlling carriers I1 and I2 injected into the TE-mode semiconductor laser structure and the TM-mode semiconductor laser structure. After that state is obtained, oscillation can occur in a polarization mode of a smaller threshold by slightly controlling the phase condition and the like with a modulated current or voltage and thus the polarization switching can be effected.

The present invention is directed to a semiconductor laser capable of switching a polarization mode of output light, which includes a first semiconductor laser structure, a gain for a first polarization mode being larger than a gain for a second polarization mode in the first semiconductor laser structure, and a second semiconductor laser structure, a gain for the second polarization mode being larger than a gain for the first polarization mode in the second semiconductor laser structure, and in which the first semiconductor laser structure and the second semiconductor laser structure are arranged with a spacing therebetween in a light waveguide direction, and its fabrication method.

More specifically, a laser of the present invention can be constructed in the following various manners, for example.

In a composite cavity type semiconductor laser in which there are serially arranged in its waveguide direction two different first and second semiconductor laser structures that respectively permit first and second polarization modes and have mutually-different active layers and waveguide layers (or light guide layers), the first semiconductor laser structure has an active region, in which a gain for the first polarization mode is larger than a gain for the second polarization mode, and one of distributed feedback type and distributed Bragg reflection type cavities, the second semiconductor laser structure has an active region, in which a gain for the second polarization mode is larger than a gain for the first polarization mode, and one of distributed feedback type, distributed Bragg reflection type and Fabry-Perot type cavities, the first and second semiconductor laser structures are built such that propagation constants for each of the first and second polarization modes are about equal to each other between the first and second semiconductor laser structures, the first semiconductor laser structure and the second semiconductor laser structure are arranged with a spacing therebetween in the light waveguide direction, the Bragg wavelength of the DFB cavity or the DBR cavity is set close to a peak wavelength of a gain spectrum of the semiconductor laser structure, and the oscillation polarization can be switched between the first polarization mode and the second polarization mode by modulating carriers injected into at least one of the first and second semiconductor laser structures.

In the above structure, when each of the TE mode and the TM mode is a DFB mode or a DBR mode, the oscillation wavelength can be stabilized even during the modulation time, and a threshold gain, at which oscillations in the TE mode and the TM mode can be simultaneously effected, can be readily set.

When one is a TE Fabry-Perot mode and the other is a DFB mode or a DBR mode, a threshold gain, at which oscillations in the TE mode and the TM mode can be simultaneously effected, can be readily set, fabrication and packaging of the device can be further facilitated and the polarization-modulation operation range due to a composite cavity can be further widened. In this case, it is preferable to use only a stable TM mode as a signal. Thus, a polarization selective semiconductor laser, whose fabrication controllability is improved and whose polarization-modulation operation range is extended, can be obtained based on the above-given design principle.

The first and second semiconductor laser structures may respectively have substrates with layer structures thereon formed independently from each other, and they may be disposed on a support member with a spacing interposed therebetween in the waveguide direction. According thereto, the TE-mode and TM-mode semiconductor laser structures can be independently fabricated, and a degree of design freedom can be further increased. Further, an optical-axis adjustment between the two laser structures can be accurately performed.

At least active layers and waveguide layers of the first and second semiconductor laser structures may be respectively formed on a common substrate, and the layer structures on the common substrate may be disposed with a spacing interposed therebetween in the waveguide direction.

The spacing between the first and second semiconductor laser structures may be filled with a filler to form a phase control region. Thereby, the phase can be adjusted and the polarization modulation can be accurately performed by a composite cavity.

The filler filling the spacing may be material whose refractive index can be electrically controlled, and an optical-length modulating unit for modulating the optical length of the phase control region may be arranged. Thereby, the phase adjustment can be varied and the polarization-modulation operation range due to a composite cavity can be further expanded.

The first and second semiconductor laser structures may respectively have a DFB cavity or a DBR cavity, and end facets of the first semiconductor laser structure and the second semiconductor laser structure, opposed to each other with the spacing therebetween, may be formed slantingly to the waveguide direction. Thereby, where the two semiconductor laser structures are respectively DFB or DBR lasers, adverse influences of reflections at the end facets can be depressed and the polarization modulation due to a composite cavity can be ensured.

The second semiconductor laser structure may have a Fabry-Perot cavity, and an end facet of the first semiconductor laser structure of a DFB or DBR laser out of end facets of the first semiconductor laser structure and the second semiconductor laser structure, opposed to each other with the spacing therebetween, may be formed slantingly to the waveguide direction. Thereby, where one of the two semiconductor laser structures is a DFB or DBR laser and the other is a Fabry-Perot type semiconductor laser structure, adverse influences of reflections at the end facets can be depressed and the polarization modulation due to a composite cavity can be ensured.

AR coats may be provided on opposed end facets of the first semiconductor laser structure and the second semiconductor laser structure to depress reflections at the end facets. Thereby, adverse influences of reflections at the end facets can be depressed and the polarization modulation due to a composite cavity can be ensured. Further, adverse influences due to reflections at the laser's end facets or the phase are depressed and hence characteristics of the semiconductor laser can be stabilized and its yield can be improved.

At least one of the first semiconductor laser structure and the second semiconductor laser structure may include an active region of a quantum well structure or a strained quantum well structure. Thereby, threshold gains for the TE mode and the TM mode can be readily caused to compete with each other, and the polarization-modulation can be positively ensured.

Further, a laser array of the present invention can be constructed in the following manners, for example.

In a composite cavity type semiconductor laser array in which there are serially arranged in its waveguide direction two different semiconductor laser arrays that respectively permit first and second polarization modes, a first semiconductor laser array composed of a plurality of first semiconductor laser structures includes a plurality of the first semiconductor laser structures arranged in a parallel manner in the waveguide direction, and a common active region, in which a gain peak for the first polarization mode can be changed by the amount of carriers injected therein, each first semiconductor laser structure includes a DFB cavity or a DBR cavity whose Bragg wavelength is set close to the varying gain peak, a second semiconductor laser array composed of a plurality of (the same number as the number of the first semiconductor laser structures) second semiconductor laser structures includes a plurality of the second semiconductor laser structures arranged in the same manner as that of the first semiconductor laser structures, and a common active region, in which a gain for the second polarization mode is larger than a gain for the first polarization mode, each second semiconductor laser structure includes a Fabry-Perot cavity, paired first and second semiconductor laser structures are constructed such that propagation constants for each of the first polarization mode and the second polarization mode are about equal to each other between the paired first and second semiconductor laser structures, the first semiconductor laser array and the second semiconductor laser array are arranged with a spacing therebetween in the light waveguide direction, and the semiconductor laser array is constructed such that the polarization mode thereof is switched between the first polarization mode and the second polarization mode by a control of carriers injected into at least one of the first semiconductor laser structure and the second semiconductor laser structure.

In that structure, since the second semiconductor laser structure of a Fabry-Perot cavity type can be simplified, the arrayal of multi-wavelength semiconductor laser structures can be readily achieved. Further, the second semiconductor laser structure of a Fabry-Perot type can be freely designed in accordance with the first semiconductor laser structure of a DFB or DBR type, and the oscillation light in a dominant mode of the first semiconductor laser can be accurately used by the polarization-modulation operation even if the oscillation light in a dominant mode of the second semiconductor laser is somewhat degraded in its quality.

The spacing between the first and second semiconductor laser arrays may be filled with a filler to form a phase control region. Thereby, the phase can be adjusted, and the polarization modulation can be accurately performed by a composite cavity.

The filler filling the spacing may be material whose refractive index can be electrically controlled, and an optical-length modulating unit for modulating the optical length of the phase control region may be arranged. Thereby, the phase adjustment can be varied, and the polarization-modulation operation range due to a composite cavity can be further expanded.

A fabrication method of a laser of the present invention can be constructed in the following manners, for example.

In a fabrication method of the above-discussed semiconductor laser, the fabrication method of a polarization selective semiconductor laser includes a step of fabricating a first semiconductor laser structure, a step of fabricating a second semiconductor laser structure independently from the fabricating step of the first semiconductor laser structure and a step of arranging the first semiconductor laser structure and the second semiconductor laser structure serially along a waveguide direction on a common support member with a spacing therebetween such that the first and second semiconductor laser structures are optically coupled to each other.

According to that method, semiconductor laser structures for the TE mode and the TM mode can be independently fabricated an d the optical-axis adjustment can be accurately performed. Further, when a polarization selective semiconductor laser is to be built, such fabrication method and phase control method as enable more accurate packaging can be provided.

The above-discussed arranging step may include a step, in which one of the first semiconductor laser structure and the second semiconductor laser structure is caused to emit light after the first semiconductor laser structure is positioned on the support member and fixed thereto, and the other of the first semiconductor laser structure and the second semiconductor laser structure is caused to receive the light output from the one of the first semiconductor laser structure and the second semiconductor laser structure, as a photodetector, and is positioned. Thereby, the two semiconductor laser structures can be more readily aligned with each other.

The above-discussed arranging step may include a step in which the semiconductor laser structure and the support member are brought into a desired positional relationship and the semiconductor laser structure is positioned, using a marker provided on at least one of the semiconductor laser structure and the support member. Thereby, the alignment can be readily attained and the optical-axis adjustment can be accurately achieved.

The above-discussed arranging step may include a step in which a side face of the semiconductor laser structure is abutted against a abutment portion of the support member, which is perpendicular to a laser mounting surface of the support member, and is positioned. Thereby, the alignment can be readily achieved.

The above fabrication method may further include a step of filling the spacing with a filler having a desired refractive index. The phase can be adjusted even when the spacing between the two lasers is left as it is, but the phase adjustment can be more flexibly performed when the spacing is filled with material having a desired refractive index.

Further, in a fabrication method of the above-discussed semiconductor laser, the fabrication method of a polarization selective semiconductor laser includes a step of fabricating a first semiconductor laser structure on a substrate, a step of fabricating a second semiconductor laser structure on the substrate, and a step of forming a spacing between the first semiconductor laser structure and the second semiconductor laser structure.

Thereby, an abnormal structure formed at a boundary between the two semiconductor laser structures during its fabrication process can be removed, and a spacing, which is to be formed as a phase control portion, can be formed. Thus, problems of structure and fabrication process due to the abnormal structure can be solved at the same time.

In the above fabrication method, the fabrication step of the first semiconductor laser structure may include a step of forming a first active layer and a first light guide layer only on a region of the first semiconductor laser structure on the substrate and a step of forming a first grating, whose pitch is controlled such that the Bragg wavelength is close to a gain peak wavelength of the first active layer, on the first light guide layer, the fabrication step of the second semiconductor laser structure may include a step of forming a second active layer and a second light guide layer only on a region of the second semiconductor laser structure on the substrate and a step of forming a second grating, whose pitch is controlled such that the Bragg wavelength is close to a gain peak wavelength of the second active layer, on the second light guide layer, and both of the fabrication step of the first semiconductor laser structure and the fabrication step of the second semiconductor laser structure may include a step of forming a common clad layer and a common contact layer on the first light guide layer with the first grating and on the second light guide layer with the second grating.

In the above fabrication method, both of the fabrication step of the first semiconductor laser structure and the fabrication step of the second semiconductor laser structure may include a step of forming a first clad layer, an active layer and a light guide layer on the entire substrate, a step of forming a grating, whose pitch is controlled such that the Bragg wavelength is close to a gain peak wavelength of the active layer, only on the light guide layer in a region of the first semiconductor laser structure with the light;guide layer in a region of the second semiconductor laser structure being left as it is, and a step of forming a common second clad layer and a common contact layer on the entire light guide layer.

The above step of forming the spacing at the boundary portion between the first and second semiconductor laser structures may include a step of simultaneously forming a slit-like spacing at the boundary portion and a ridge waveguide.

The above fabrication method may further include a step of filling the spacing with a filler having a desired refractive index.

Further, an optical transmitter can be constructed using the above-discussed laser.

In an example of the transmitter, there is arranged, at an output portion of the polarization selective semiconductor laser of the present invention, a polarization selecting unit, such as a polarizer, for selecting only one polarization mode and outputting it. Thereby, there is provided an optical transmitter in which a modulation electric power is small and which can output an optical signal with a narrow line width and a large extinction ratio.

Further, an optical transceiver can be constructed using the above-discussed laser. An example of the optical transceiver may include the above-discussed polarization selective semiconductor laser, a polarization selecting unit for transmitting only light in one polarization mode out of output light from the semiconductor laser, a control circuit for controlling and driving the semiconductor laser to switch the polarization mode of the output light of the semiconductor laser in accordance with an input signal thereinto, and a receiving unit for receiving an input signal thereinto.

Further, a light source apparatus can be constructed using the above-discussed laser. An example of the light source apparatus may include the above-discussed polarization selective semiconductor laser, and a polarization selecting unit for transmitting only light in one of the TE mode and the TM mode out of output light from the semiconductor laser.

Furthermore, optical transmission and communication systems can be constructed using a transmitter with a semiconductor laser of the present invention. Thereby, an intensity-modulated signal with a small fluctuation in its output power and small chirping can be obtained even during high-speed modulation time, and a conventional simple receiver can be used since the receiver only needs to receive the intensity-modulated signal.

When the transmitter or the transceiver can supply optical signals of plural different wavelengths, wavelength-division multiplexing networks can be constructed.

Further, an optical communication method can be constructed. In an example of the communication method, a light source apparatus including the above-discussed polarization selective semiconductor laser and a polarization selecting unit for picking out only light in one of the TE mode and the TM mode out of output light from the semiconductor laser is used, signal light intensity-modulated in accordance with a transmission signal is picked out from the polarization selecting unit by supplying a signal current, which is created by superimposing a moudlation current modulated according to the transmission signal on a predetermined bias current, to the polarization selective semiconductor laser, and the signal light is transmitted towards an optical receiver side.

Other objects and features of the present invention will be apparent from the following specification and accompanying drawings.

DESCRIPTION OF THE PREFERRED EMBODIMENT

First Embodiment

Figure 1:
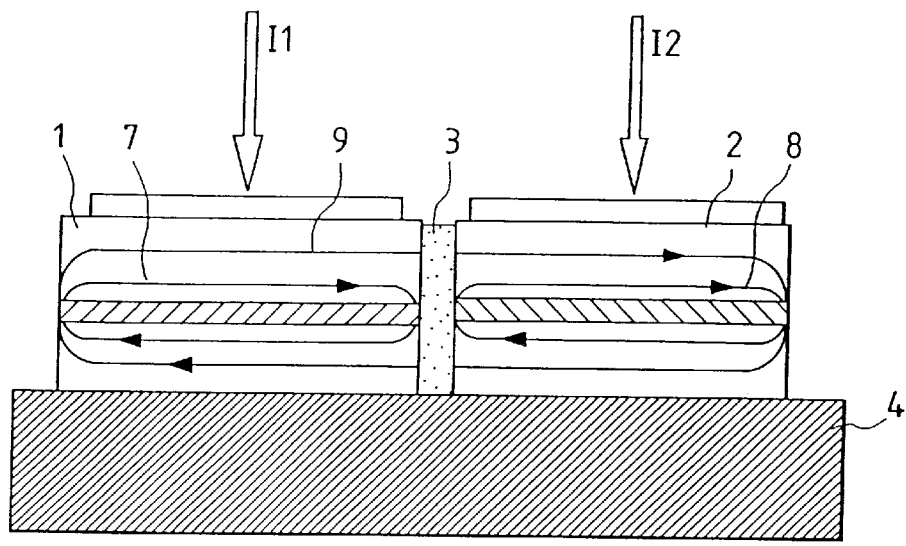
FIG. 1 is a cross-sectional view for explaining the principle of the present invention using its typical example.
Figure 2:
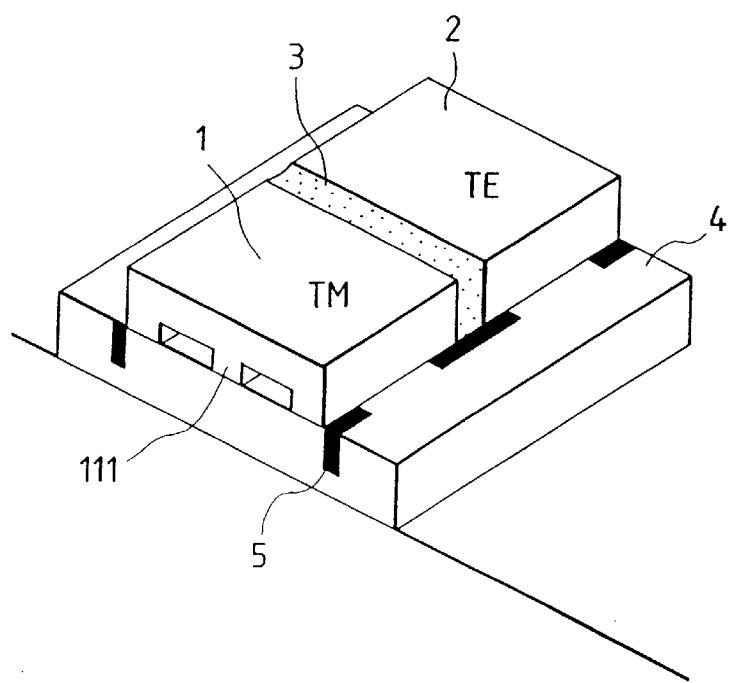
FIG. 2 is a perspective view illustrating a first embodiment of the present invention.

FIG. 2 illustrates a first embodiment. In FIG. 2, reference numeral 1 denotes a first semiconductor laser, reference numeral 2 designates a second semiconductor laser, reference numeral 3 denotes a filler filling a spacing, reference numeral 4 designates a heat sink, and reference numeral 5 denotes a marker. The semiconductor lasers 1 and 2 are disposed on the heat sink 4 mounted on a sub-carrier (not shown). The semiconductor lasers may be mounted directly on the sub-carrier.

Figure 3:
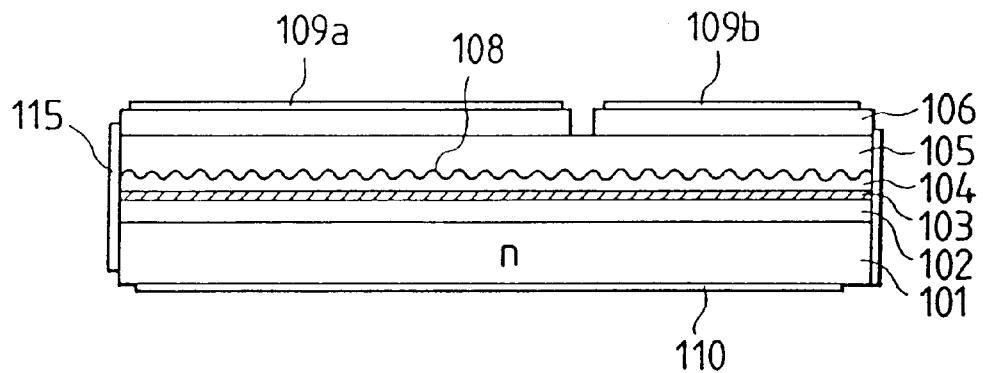
FIG. 3 is a cross-sectional view taken along a cavity direction of a semiconductor laser structure for explaining the first embodiment of the present invention.
Figure 4:
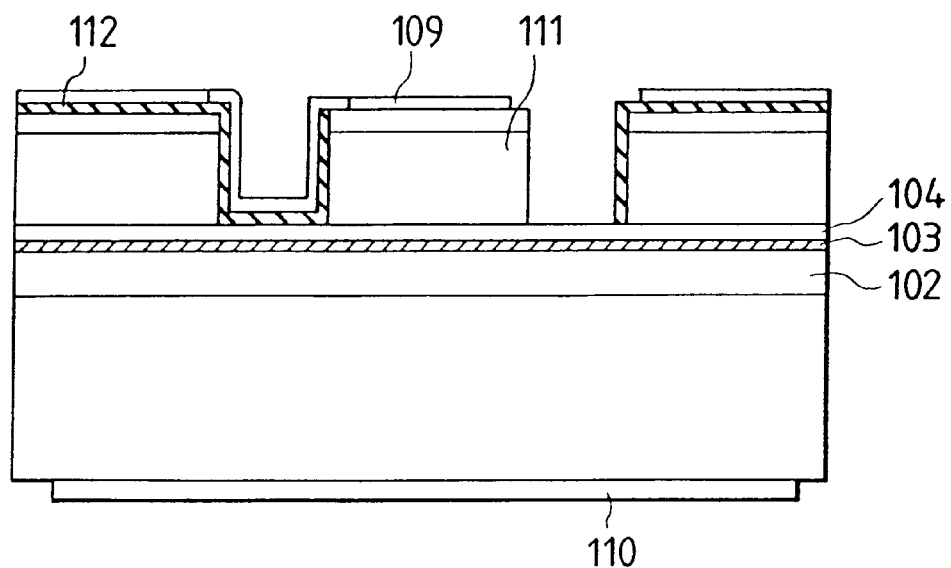
FIG. 4 is a cross-sectional view taken along a direction perpendicular to the cavity direction of the semiconductor laser structure for explaining the first embodiment of the present invention.

A fabrication method of the semiconductor laser will be initially described. FIG. 3 is a cross-sectional view taken along a direction including an oscillation axis of the first semiconductor laser 1. FIG. 4 is a cross-sectional view taken along a direction perpendicular to the direction of FIG. 3. On an n-type (100) InP substrate 101, an n-InP clad layer 102, an undoped active layer 103 and a p-InGaAsP light guide layer 104 are laid down using a metal organic chemical vapor deposition (MOCVD) method or a chemical beam epitaxy (CBE) method. Then, a phase-shifted grating 108 is formed with a pitch of 325 nm and a depth of 50 nm, and a p-InP clad layer 105 and a p-InGaAs contact layer (a cap layer) are deposited on the grating 108. Reference numeral 115 designates an antireflection (AR) coat provided on each of both opposite end facets of the device for reducing reflection on the end facet.

Figure 5:
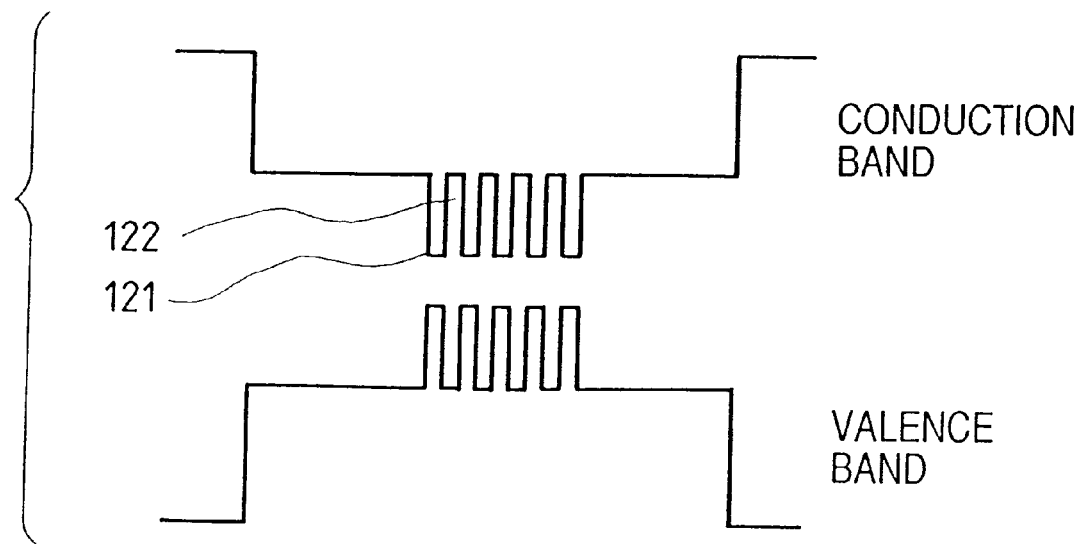
FIG. 5 is a view for explaining the band gap structure of one active layer in the first embodiment of the present invention.

FIG. 5 is a band diagram of the active layer 103 with separate confinement heterostructure (SCH) layers formed on upper and lower sides thereof. In FIG. 5, reference numeral 121 denotes a tensile strained InGaAs well layer formed with the amount of a tensile strain of 0.9% and a thickness of 9 nm, and reference numeral 122 denotes a non-strained InGaAsP barrier layer formed with a band gap of 0.99 eV and a thickness of 10 nm. The number of the well layers 121 is five (5).

As illustrated in FIG. 4, a waveguide structure with a width of 2.5 $\mu$m is adopted for control of its transverse mode. In FIG. 4, reference numeral 111 denotes a ridge type light waveguide, and reference numeral 112 denotes an insulating film, such as a $SiO_x$ layer, for preventing a current flow into portions other than the ridge portion. Further, reference numeral 109 denotes a positive electrode formed on an upper surface of the substrate (as illustrated in FIG. 3, the positive electrode 109 is separated into two portions 109a and 109b arranged in the cavity direction), and reference numeral 110 designates a negative electrode on a bottom surface of the substrate. In this embodiment, the positive electrode 109 is divided into two portions (in this case, the distribution of injected carriers can be controlled and the polarization-modulation operation range can be expanded), but it may be a single electrode. In FIG. 4, layer structures projecting on both lateral sides of the ridge-type light waveguide 111 are not what are needed functionally, but those structures have been only formed as a result of an etching process for forming the ridge-type light waveguide 111.

The tensile-strained multiple quantum well structure is used as the active layer 103 and the Bragg wavelength is set close to its gain peak wavelength by appropriately setting the pitch of the grating 108 and the like. As a result, the TM-mode gain always surpasses the TE-mode gain, so that oscillation always occurs in a DFB mode of the TM polarization. In this embodiment, the grating 108 is formed after the active layer 103 is grown since the formation precision of the grating is considered at present to be technically superior to the wavelength controllability of crystalline growth (i.e., it is considered to be favorable that after the active layer is grown and its gain peak wavelength is determined, the pitch of the grating and the like are determined according to the gain peak wavelength). If both of them can be fabricated with high precision, the active layer and the like may be formed after the grating is formed directly on the substrate. This is also true in the other embodiments.

Next, a fabrication method of the second semiconductor laser will be described. In the first embodiment, layer thicknesses and compositions of the second semiconductor laser 2 are controlled such that the propagation constant for the TE mode in the first semiconductor laser 1 is equal to that in the second semiconductor laser 2. Fundamentally, the structures other than the active layers may be approximately equal to each other between the first and second semiconductor lasers 1 and 2. The transverse mode of the second semiconductor laser 2 is also controlled using the ridge structure, but its width is not necessarily equal to that of the first semiconductor laser 1. When the widths of the ridge structures of the first and second semiconductor lasers 1 and 2 are different from each other, the propagation constants of the both semiconductor lasers 1 and 2 only need to be equalized to each other by modifying other structural parameters considering the difference in the widths of the ridge structures.

Figure 6:
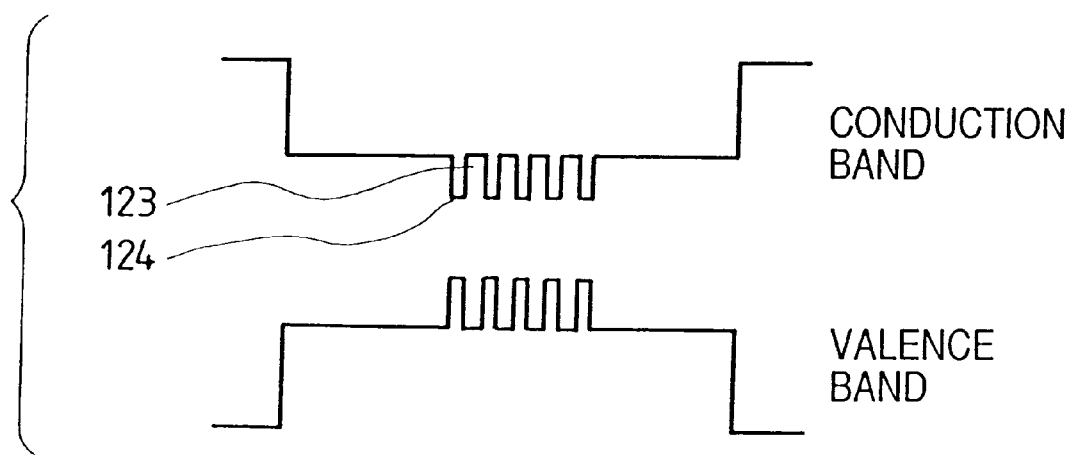
FIG. 6 is a view for explaining the band gap structure of the other active layer in the first embodiment of the present invention.

FIG. 6 illustrates the band diagram structure of the active layer in the second semiconductor laser 2 (SCH layers are respectively formed on upper and lower sides of the active layer). Reference numeral 124 denotes a non-strained InGaAs well layer formed with a thickness of 7.5 nm, and reference numeral 123 denotes a non-strained InGaAsP barrier layer formed with a band gap of 0.99 eV and a thickness of 10 nm. The number of the well layers is five (5). As a result, a transition between heavy holes and electrons becomes dominant, and the TE-mode gain always exceeds the TM-mode gain. Further, since the Bragg wavelength is set close to the peak wavelength of the TE-mode gain, oscillation always occurs in a DFB mode of the TE polarization.

In order that the first and second semiconductor lasers 1 and 2 can readily constitute a composite cavity, it is desirable that those lasers are the same with each other except the polarization mode. For example, the threshold current and efficiency can be adjusted by the cavity length and the reflectance at the end facet. In order that the DFB mode prevails, it is desirable that reflectance at the both opposite end facets are as low as possible. Thus, one important feature of the present invention is that the structures of the first and second semiconductor lasers can be readily and independently controlled and selected.

Next, a method for mounting the two semiconductor lasers 1 and 2 on the heat sink 4 will be described with reference to FIG. 2. For example, the first semiconductor laser 1 is die-bonded to a desired position indicated by the marker 5 with its epi-side being down. The position of the second semiconductor laser 2 is adjusted by oscillating the second semiconductor laser 2 with a pulsative current driving and causing the first semiconductor laser 1 to function as a waveguide type photodetector. After the positional adjustment of the second semiconductor laser 2 is completed, the first semiconductor laser 1 is in turn driven in a pulsative manner and the second semiconductor laser 2 is caused to function as a photodetector. After confirming light reception by the second semiconductor laser 2, the second semiconductor laser 2 is die-bonded. As a result, two semiconductor lasers 1 and 2 are fixed to the heat sink 4 in an optimum optically-coupled state. Though the coupling efficiency of optical power is large, the size of the spacing 3 formed between the two semiconductor lasers 1 and 2 is somewhat difficult to control and hence the phase tends to shift. Therefore, it can be considered that the polarization modulation is hard to achieve or the device only operates in one of the TE mode and the TM mode. To solve that problem, the spacing formed between the two semiconductor lasers 1 and 2 is filled with the filler 3, such as gel and polymer, whose refractive index can be controlled thereat. Thus, it is possible to achieve the polarization modulation with good yield. Further, in place of the gel and the polymer, the spacing may be filled with liquid crystal (LC) whose refractive index or transmissivity (the transmissivity can also be termed absorptivity, and the refractive index and the transmissivity are equivalent to each other from the viewpoint of a complex refractive index, so that the polarization modulation can also be achieved with good yield by the adjustment of the transmissivity) can be varied by applying a voltage across the LC through an electrode formed thereon.

Figure 7:
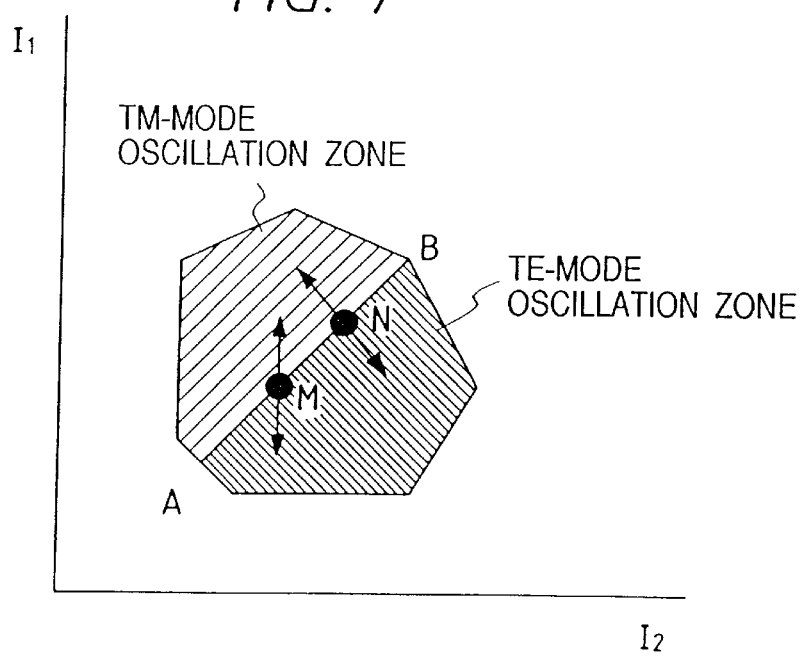
FIG. 7 is a graph illustrating the relationship between amounts of currents injected into two semiconductor laser structures and an oscillation polarization mode.

The operation of the first embodiment will be described. FIG. 7 shows the distribution of the polarization mode at the time currents (I1 and I2) are independently injected into the first and second semiconductor lasers 1 and 2. Its boundary line A–B indicates that threshold gains for the TE mode and the TM mode are approximately equal to each other. When a modulation signal is superimposed with that boundary line being a bias point (for example, a point M or N), the oscillation polarization mode can be switched or the polarization modulation can be achieved. There are illustrated a case where the modulation signal is only superimposed on I1 with the bias point being set at the point M, and a case where the modulation signals with opposite phases to each other are superimposed on I1 and I2 with the bias point being set at the point N. Further, when the positive electrode of the first semiconductor laser 1 is divided into two electrodes 109a and 109b, the phase of light in each polarization mode can be finely adjusted by unevenly injecting currents through those positive electrodes. Thus, the polarization-modulation range can be further expanded.

Technical advantages of the first embodiment are as follows:

(1) Semiconductor lasers for the TE mode and the TM mode can be independently and separately optimized;

(2) Appropriate laser diodes can be selected from a plurality of semiconductors of the same kind in order to build the above-discussed construction;

(3) Both of the TE-mode light and the TM-mode light can be used for optical communications since both of them have good qualities about line widths and the like; and (4) Even if the phase of light does not match, the adjustment of the phase can be readily performed by adjusting the spacing, the filler or the like.

In the first embodiment, transverse modes of the two semiconductor lasers 1 and 2 are controlled by the ridge structure. However, confinement structure in the transverse direction is not limited to the ridge structure, but other structures, such as a burying structure, that have been used in conventional semiconductor lasers, can also be employed.

Second Embodiment

A polarization selective semiconductor laser of a second embodiment can be more easily fabricated, compared with the first embodiment.

The second embodiment differs from the first embodiment in the following points:

(1) A DFB semiconductor laser and a Fabry-Perot type semiconductor laser are selected as a combination of two semiconductor lasers; and (2) A heat sink (or a support member such as sub-carrier) with a abutment surface perpendicular to a surface to which the laser is to be fixed.

Figure 9:
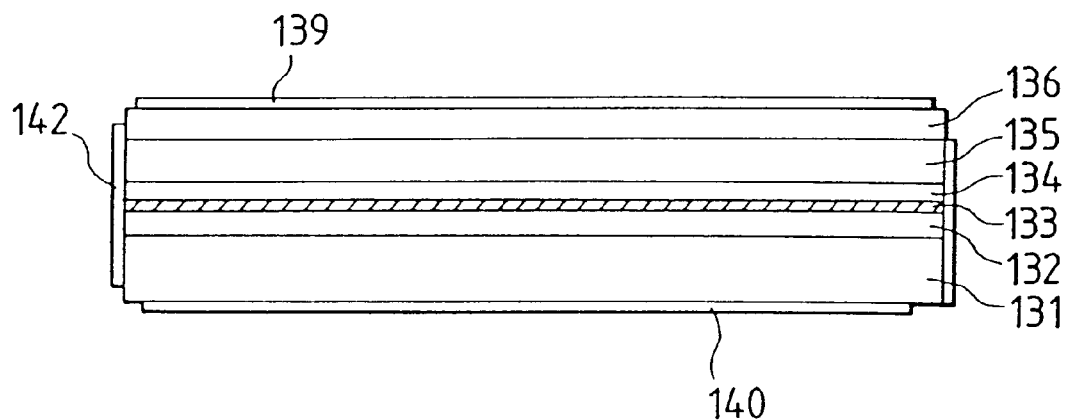
FIG. 9 is a cross-sectional view taken along a cavity direction of a Fabry-Perot type semiconductor laser structure for explaining the second embodiment of the present invention.
Figure 10:
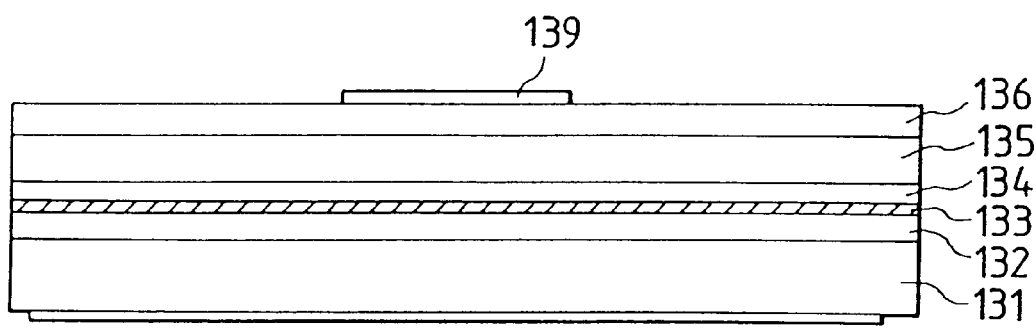
FIG. 10 is a cross-sectional view taken along a direction perpendicular to the cavity direction of the Fabry-Perot semiconductor laser structure for explaining the second embodiment of the present invention.

A fabrication method of the laser will be initially described. The structure of a first DFB semiconductor laser may be basically the same as that of the first or second semiconductor laser in the first embodiment. FIG. 9 illustrates a cross section of a second Fabry-Perot semiconductor laser including its oscillation axis, and FIG. 10 illustrates a cross section thereof perpendicular to the cross section of FIG. 9. In its fabrication method, an n-InP clad layer 132, an undoped active layer 133, an n-InGaAsP light guide layer 134, a p-InP clad layer 135 and a p-InP contact layer 136 are laid down over an n-type (100) InP substrate 131. The structure of the active layer 133 may be the same as that of the first embodiment.

No control of the transverse mode is conducted intentionally in this embodiment. Only an electrode stripe 139 with a width of 50 µm is formed, for example. As a result, though the second semiconductor laser always oscillates in the TE mode, its oscillation mode is a Fabry-Perot multi-mode that is different from the first embodiment since there is no grating and no transverse-mode control mechanism.

Reflectances at opposed end facets of the first and second semiconductor lasers are desirably as low as possible. For that purpose, AR coats 115 and 142 are respectively formed on the end facets of the lasers as illustrated in FIGS. 3 and 9. Further, during the fabrication, widths of the first and second semiconductor lasers are made substantially equal to each other, and their side faces are desirably made as a cleaved face since those side faces are brought into contact with the perpendicular abutment face of the heat sink 4. Reference numeral 140 denotes an electrode formed on the bottom surface of the substrate.

Figure 8:
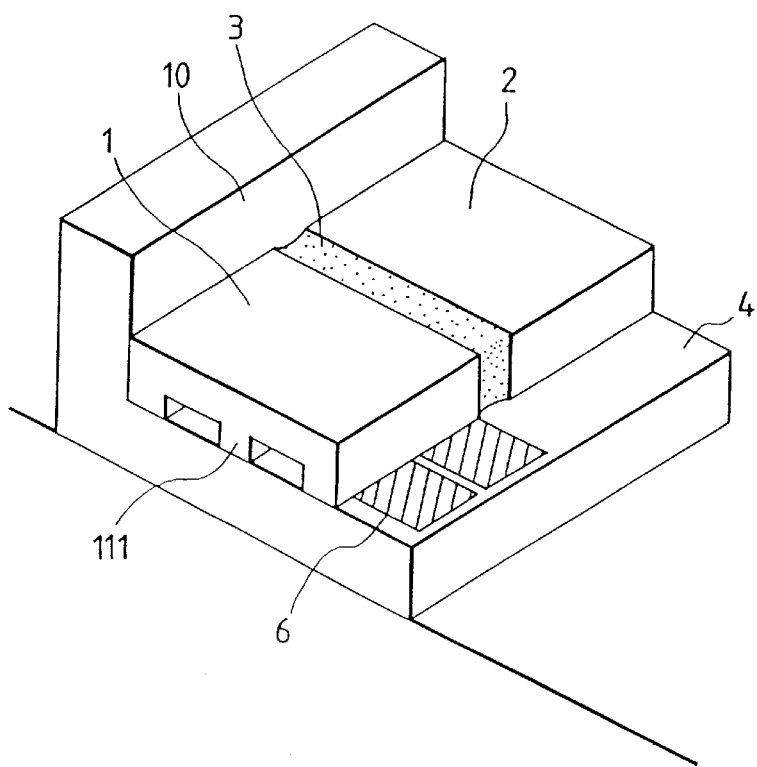
FIG. 8 is a perspective view illustrating a second embodiment of the present invention.

Next, a method of mounting the two semiconductor lasers to the support member, such as the heat sink and the sub-carrier, will be described with reference to FIG. 8. In FIG. 8, there is formed on the heat sink 4 a surface 10 which is perpendicular to the face for fixing the semiconductor laser thereto. On the laser fixing surface, a pattern electrode 6 (one on the side of the laser 1 is only illustrated) is formed, and the pattern electrode 6 is connected to the electrode of each of the two semiconductor lasers 1 and 2. No such elements are not illustrated in FIG. 2, but the structure is also the same in FIG. 2. The semiconductor lasers 1 and 2 are respectively positioned by abutting chip side faces thereof against the perpendicular surface 10 of the heat sink 4.

In the case of the second embodiment, there is necessarily no need to perform the active alignment (an alignment method in which oscillation is executed and the oscillation is detected) as is carried out in the first embodiment. Markers (not shown) are beforehand provided on the heat sink 4 and the laser chips 1 and 2, respectively, and a sufficient precision can be obtained by aligning those markers with each other while looking to them (a passive alignment). That is, in the second embodiment, the positional alignment of light waveguides in the two semiconductor lasers 1 and 2 is only conducted by the positional alignment in a direction perpendicular to the cleaved end facet of the chip. This is due to the fact that a degree of freedom in alignment of the optical axis in the transverse direction is increased since the semiconductor laser with a wide electrode stripe structure is used as the second semiconductor laser 2. If necessary, the same active alignment as that conducted in the first embodiment may be used in part.

It is a marked feature of the second embodiment that the optical-axis adjustment is very readily performed since the Fabry-Perot semiconductor laser 2 is used as discussed above.

Figure 11:
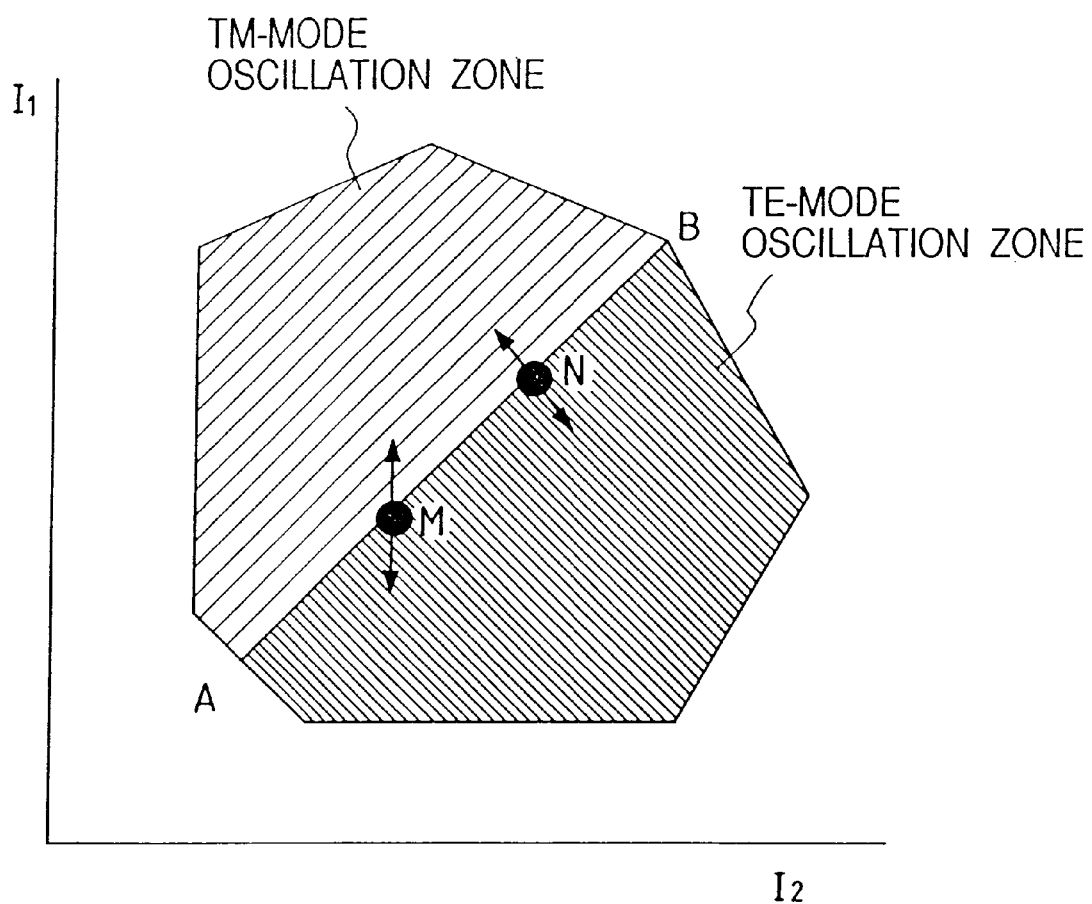
FIG. 11 is a graph illustrating the relationship between amounts of currents injected into two semiconductor laser structures and an oscillation polarization mode.

A driving method of the second embodiment will be described. FIG. 11 shows the distribution of the oscillation polarization mode at the time when currents (I1 and I2) are independently injected into the first and second semiconductor lasers 1 and 2. Its boundary line A–B indicates that threshold gains for the TE mode and the TM mode are approximately equal to each other. When a modulation signal is superimposed with that boundary line being a bias point (for example, a point M or N), the oscillation polarization mode can be switched or the polarization modulation can be achieved. The bias zone, in which the polarization modulation is possible, is wide, compared with the first embodiment, since the Fabry-Perot semiconductor laser is used as one of two semiconductor lasers in the second embodiment. That is, control ranges for light output and oscillation wavelength are wide. The operation of the second embodiment is essentially the same as that of a fourth embodiment to be described later.

Technical advantages of the second embodiment are as follows:

(1) The cost of the semiconductor laser for the TE mode, for example, is relatively low since this laser can be a simple laser with an electrode stripe;

(2) As semiconductor lasers of two kinds, appropriate laser diodes can be selected from a plurality of semiconductor lasers of any kind;

(3) The Fabry-Perot semiconductor laser is used as one of the two lasers, so that the optical-axis alignment between the two semiconductor lasers can be readily performed;

(4) Even if the phase of light does not match, the matching of the phase can be readily performed by filling the spacing with the filler 3 whose refractive index can be controlled, for example; and (5) The polarization-modulation operation range is wide since operation conditions of the Fabry-Perot semiconductor laser are not strict.

Third Embodiment

Figure 12:
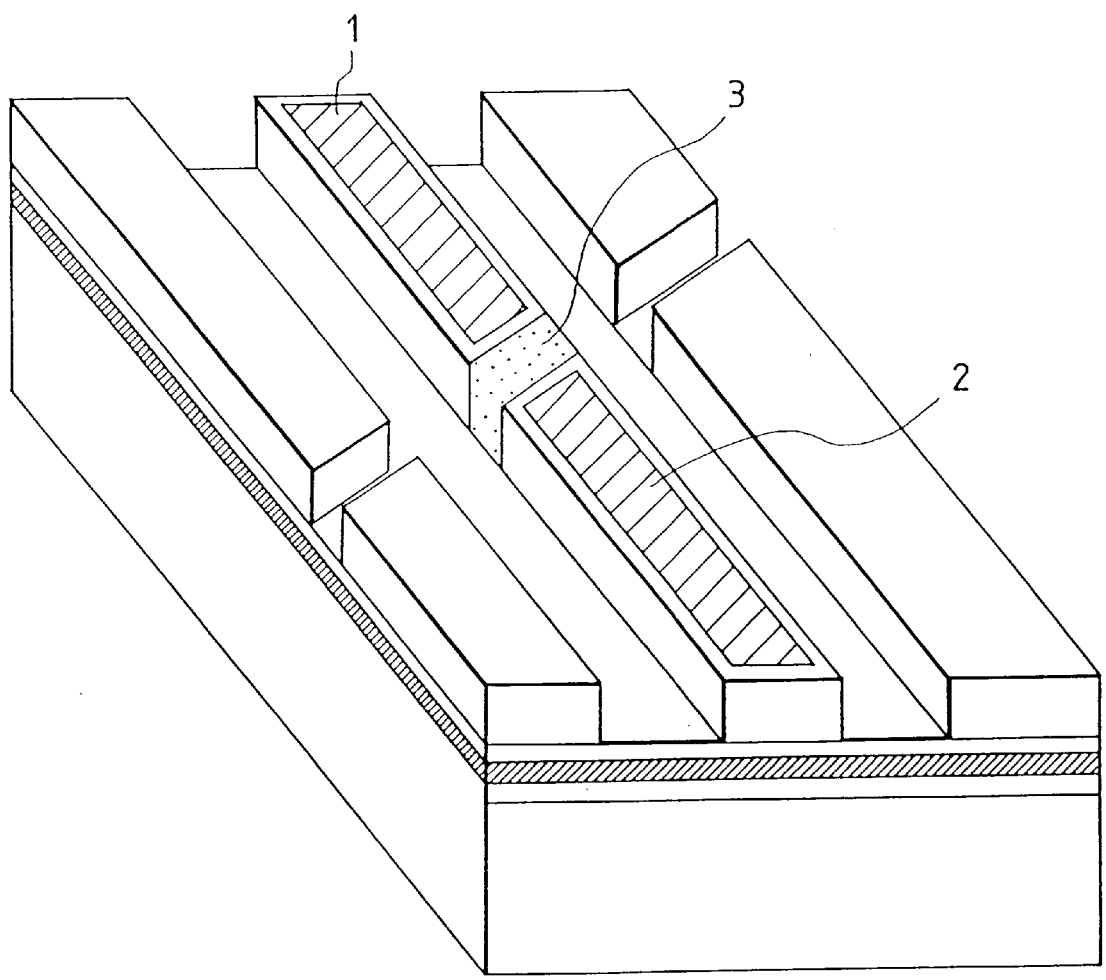
FIG. 12 is a perspective view illustrating a third embodiment of the present invention.
Figure 13:
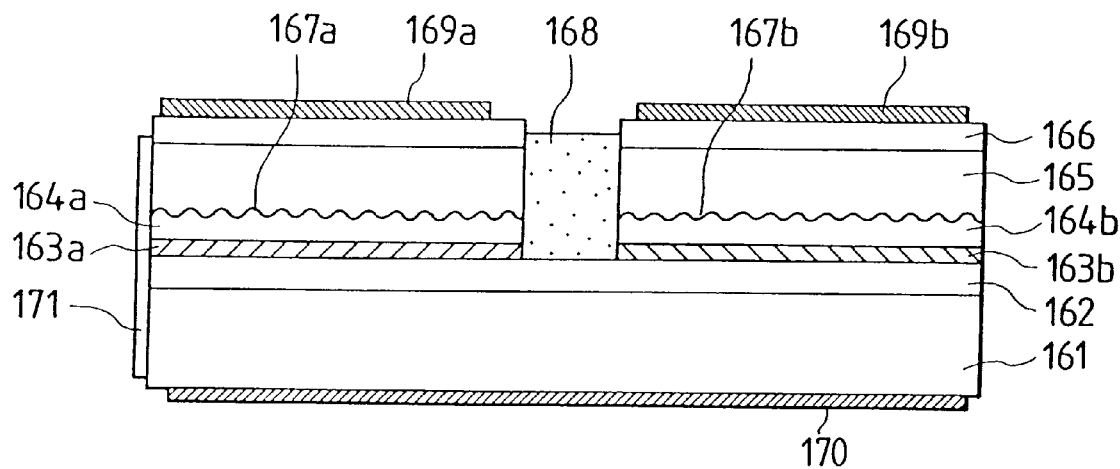
FIG. 13 is a cross-sectional view taken along a cavity direction of a polarization selective semiconductor laser for explaining the third embodiment of the present invention.
Figure 14:
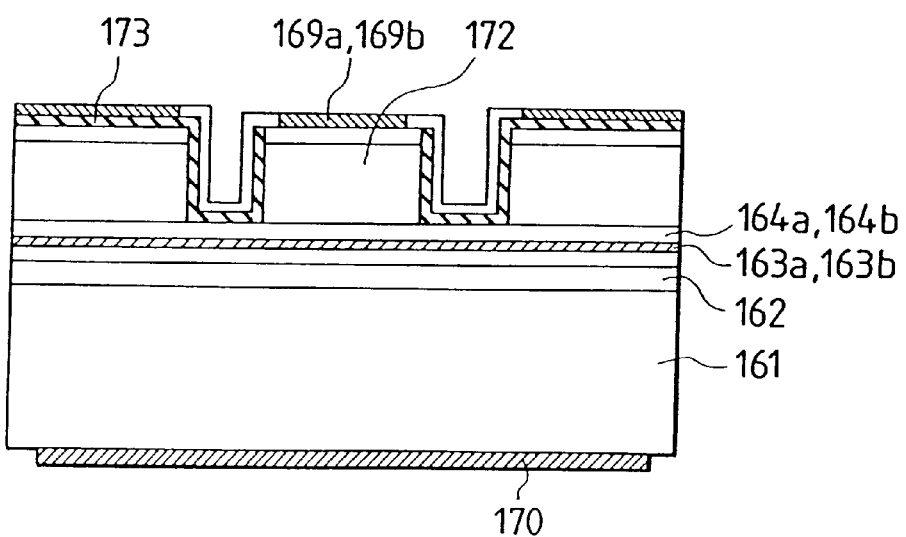
FIG. 14 is a cross-sectional view taken along a direction perpendicular to the cavity direction of the polarization selective semiconductor laser for explaining the third embodiment of the present invention.

FIG. 12 illustrates a third embodiment. In FIG. 12, reference numeral 1 denotes a first semiconductor laser, reference numeral 2 designates a second semiconductor laser, and reference numeral 3 denotes a spacing and/or a filler for filling the spacing. FIG. 13 illustrates cross sections of the first and second semiconductor lasers 1 and 2 including their oscillation axes, and FIG. 14 illustrates a cross section thereof perpendicular to the cross section of FIG. 13.

A fabrication method of the semiconductor laser of this embodiment will be initially described. FIGS. 15A through 15E illustrate fabrication steps of the third embodiment. On an n-type (100) InP substrate 161, after an n-type InP clad layer 162 is thinly formed as a buffer layer, an undoped active layer 163a and a p-InGaAsP light guide layer 164a are laid down only on a region of the first semiconductor laser using a selective mask 174a. A growth method at this time is appropriately the MOCVD method or the CBE method. Here, abnormal growth is likely to occur near the mask edge portion, but it may be left without any processing.

In place of the above step, a growth may be initially performed on the substrate 161 without any selective masks and then a region other than the region of the first semiconductor laser is removed using a selective etching.

Figure 16:
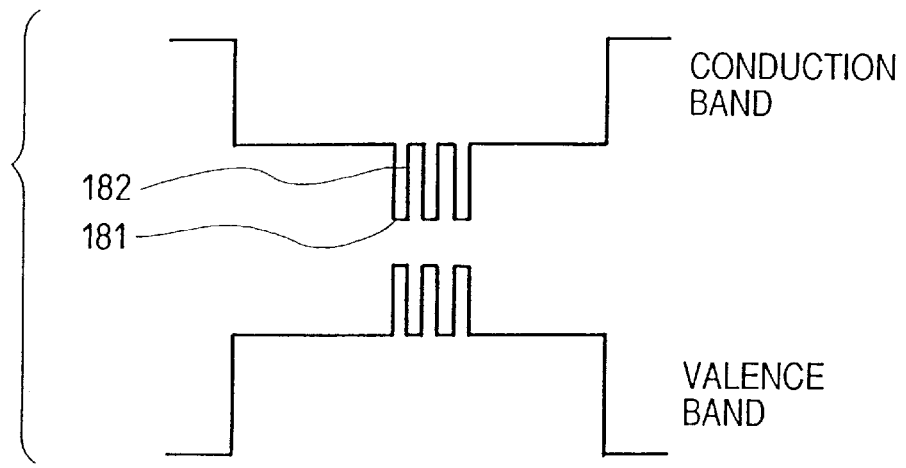
FIG. 16 is a view for explaining the band gap structure of one active layer in the third embodiment of the present invention.

FIG. 16 is the band diagram of the active layer 163a with separate confinement heterostructure (SCH) layers formed on upper and lower sides thereof. In FIG. 16, reference numeral 181 denotes a tensile strained InGaAs well layer formed with the amount of a tensile strain of 0.9% and a thickness of 9 nm, and reference numeral 182 denotes a non-strained InGaAsP barrier layer formed with a band gap of 0.99 eV and a thickness of 10 nm. The number of the well layers 181 is three (3). A gain spectrum of the active layer 163a can be predicted from photoluminescence measurement and equivalent refractive index. In the case of the third embodiment, it is predicted that the gain peak is near 1.53 μm, and the equivalent refractive index of a final device construction is measured to be 3.25. Hence, the grating pitch is selected to be 235 nm. Thus, a phase-shifted grating 167a with a pitch of 235 nm and a depth of 50 nm is formed on the light guide layer 164a (see FIG. 15A).

Then, the selective mask 174a is removed, and a new selective mask 174b is formed covering a region of the first semiconductor laser. After that, a second active layer 163b and a second light guide layer 164b are selectively grown (see FIG. 15B). Also in this case, abnormal growth is likely to appear near the edge, but it may be left as it is. The band diagram of the second active layer 163b is made the same as that of FIG. 6. Similarly to the region of the first semiconductor laser, a grating 167b with a pitch of 231 nm and a depth of 50 nm is formed on the second light guide layer 164b (see FIG. 15B).

Figure 15A:
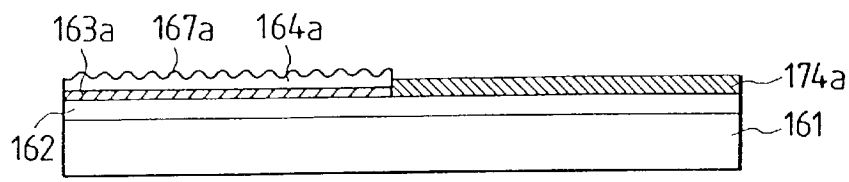
FIGS. 15A, 15B, 15C, 15D and 15E are respectively views for explaining a fabrication method of the third embodiment of the present invention.
Figure 15B:
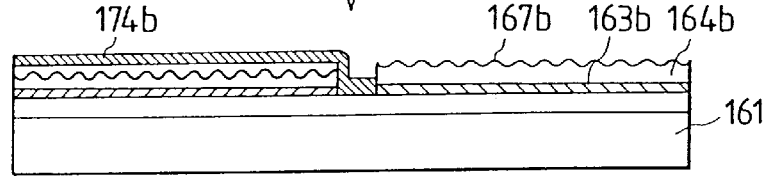
Figure 15C:
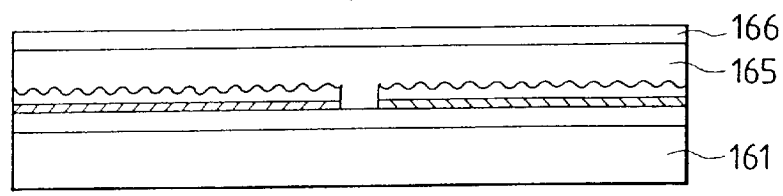
Figure 15D:
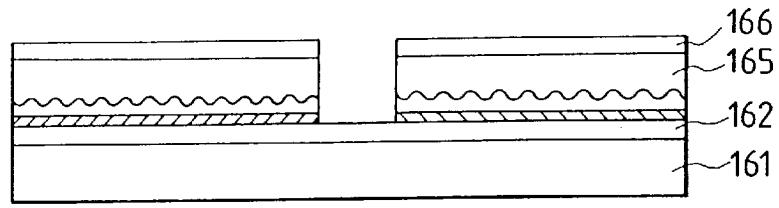
Figure 15E:
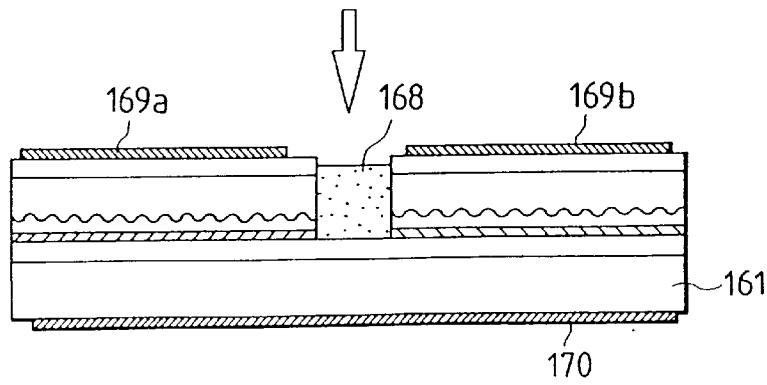

After the selective mask 174b is removed, a p-InP clad layer 165 and a p-InGaAs contact layer 166 are laid down over the entire wafer (FIG. 15C).

A process thereafter is a characteristic portion of the third embodiment. The abnormal growth portion at the boundary portion between the two semiconductor laser regions is removed in a slit-like form (see FIG. 15D). Here, a depth of the slit reaches the n-InP clad layer 162, and the slit pattern is formed in a slant form relative to a waveguide direction as indicated by reference numeral 3 in FIG. 12. This is for preventing reflections at the spacing portion as far as possible. That process can be performed by an ordinary MOCVD method and dry etching, but when that process is continuously carried out without exposing the wafer to the atmosphere in a reactive ion beam etching (RIBE) apparatus which is coupled to a CBE apparatus in a high vacuum manner, its reliability can be further improved. That process may be performed simultaneously with a next fabrication process of the ridge waveguide (see FIG. 14). Further, when an AR coat is provided on an end facet in the spacing portion 3, adverse influences of reflections can be further reduced.

Then, a ridge waveguide structure with a width of 2.5 μm is formed to control the transverse mode. In FIG. 14, reference numeral 172 denotes a ridge type light waveguide, and reference numeral 173 denotes an insulating film, such as a $SiO_x$, for preventing a current flow into portions other than the ridge portion. Further, electrodes 169a, 169b and 170 are respectively formed on upper and lower surfaces of the substrate, and an AR coat 171 is formed on an end facet. Finally, the spacing is filled with a filler 168 having a desirable refractive index, and thus the third embodiment is completed (see FIG. 15E).

Also in this embodiment, the grating is formed after the active layer is grown, but the formation of the grating is the same as that described in the first embodiment.

A driving method of the third embodiment will be described. The tensile-strained multiple quantum well structure is used as the first active layer 163a and the Bragg wavelength due to the grating 167a is set close to its gain peak wavelength. As a result, the TM-mode gain always surpasses the TE-mode gain, so that oscillation of the first semiconductor laser driven as a single unit always occurs in a DFB mode of the TM polarization. In contrast therewith, the TE-mode gain always surpasses the TM-mode gain in the second semiconductor laser 2, and the Bragg wavelength due to the grating 167b is set close to the gain peak wavelength of the TE-mode gain. As a result, oscillation of the second semiconductor laser 2 driven as a single unit always occurs in a DFB mode of the TE polarization. In the first and second semiconductor lasers 1 and 2 of this embodiment, their light waveguides are almost identical with each other except their active layers, so that propagation constants for each of the TE mode and the TM mode are set close to each other between the first and second semiconductor lasers 1 and 2. Therefore, the entire construction of the two semiconductor lasers can be set such that the TE mode or the TM mode at the Bragg wavelengths of the respective gratings 167a and 167b can have a minimum threshold gain, by controlling the numbers of carriers injected into the first and second semiconductor lasers.

For each of the two semiconductor lasers 1 and 2, however, the other cavity is a cause that disturbs the phase. So, there may be a case where it is impossible to effect the oscillation at the Bragg wavelength unless the phase is adjusted. In this case, to adjust the phases (or optical lengths) of competing light waves, the spacing 3 formed between the two semiconductor lasers 1 and 2 is filled with the filler 168, such as gel or polymer, whose refractive index can be controlled. Thus, it is possible to achieve the polarization modulation with good yield. Further, in place of the gel and the polymer, the spacing may be filled with liquid crystal whose refractive index or transmissivity can be varied by applying a voltage across the LC through an electrode formed thereon. Those are the same as the above embodiments. Furthermore, after the spacing 3 is formed, semiconductor material, such as InP or the like, may be grown epitaxially and then the electrode may be formed. Thus, the phase adjustment can be conducted by varying the amount of carries injected through that electrode.

FIG. 7 also shows the distribution of the polarization mode at the time currents (I1 and I2) are independently injected into the first and second semiconductor lasers 1 and 2 of the third embodiment. The description of FIG. 7 is the same as that made in the first embodiment.

The third embodiment is different from the first embodiment in that the first and second semiconductor lasers are not formed totally independently, but are formed with a portion being common to those lasers and that the abnormal growth portion at the boundary portion formed by its fabrication method is removed by forming a slit having a sufficient width. Technical advantages of this embodiment due to those differences are as follows:

(1) Waveguide portions at central portions of those semiconductor lasers for the TE mode and the TM mode can be independently and separately optimized;

(2) Both of the TE-mode light and the TM-mode light can be used for optical communications since both of them have good qualities about line widths and the like; and (3) Even if the phase of light does not match, the adjustment of the phase can be readily performed.

Fourth Embodiment

Figure 17:
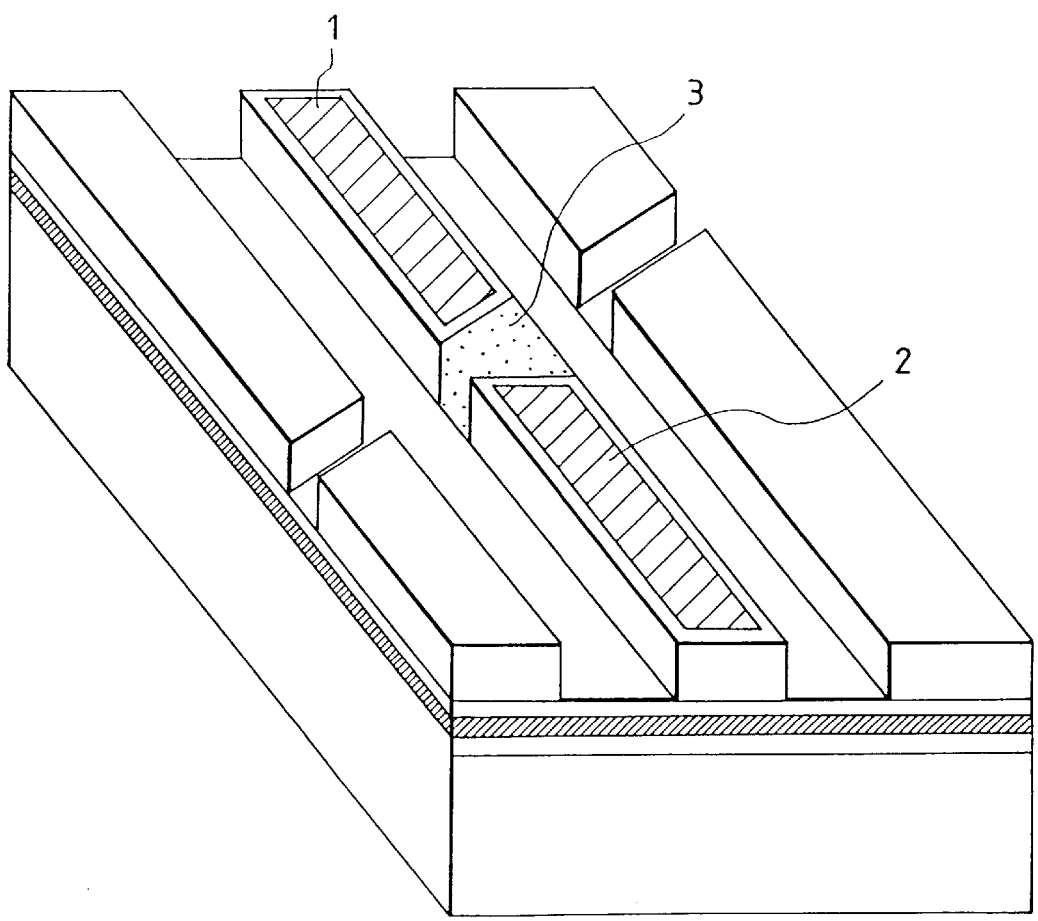
FIG. 17 is a perspective view illustrating a fourth embodiment of the present invention.

FIG. 17 illustrates a fourth embodiment. A polarization selective semiconductor laser of the fourth embodiment can be fabricated still more readily than the third embodiment. The fourth embodiment is different from the third embodiment in that one of two semiconductor lasers has a Fabry-Perot cavity.

A fabrication method of the semiconductor laser will be initially described. FIGS. 18A through 18E illustrate fabrication steps of the fourth embodiment. On an n-type (100)

InP substrate 201, an n-type InP clad layer 202, an undoped active layer 203 and a p-InGaAsP light guide layer 204 are laid down. A growth method at this time is appropriately the MOCVD method or the CBE method.

Figure 19:
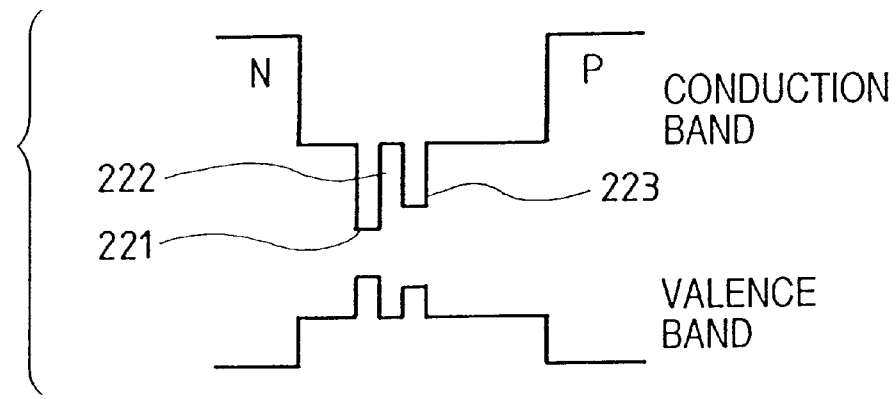
FIG. 19 is a view for explaining the band gap structure of a common active layer in the fourth embodiment of the present invention.

FIG. 19 is the band diagram of the active layer 203. In FIG. 19, reference numeral 221 denotes a tensile strained InGaAs first well layer formed with the amount of a tensile strain of 0.9% and a thickness of 9 nm, reference numeral 222 denotes a non-strained InGaAsP barrier layer formed with a band gap of 0.99 eV and a thickness of 10 nm and reference numeral 223 denotes a non-strained InGaAsP second well layer formed with a band gap of 0.75 eV and a thickness of 10 nm.

Figure 18A:
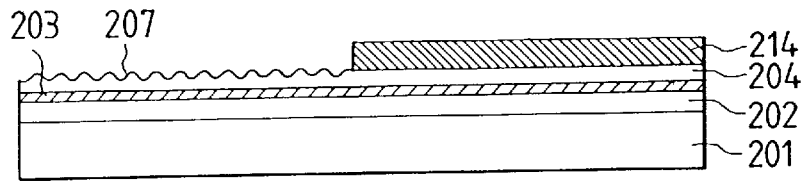
FIGS. 18A, 18B, 18C, 18D and 18E are respectively views for explaining a fabrication method of the fourth embodiment of the present invention.
Figure 18B:
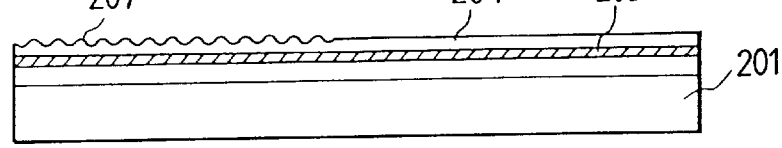
Figure 18C:
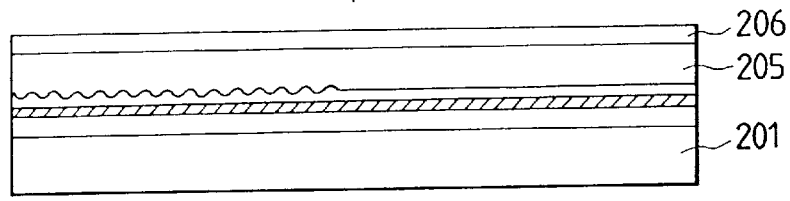
Figure 18D:
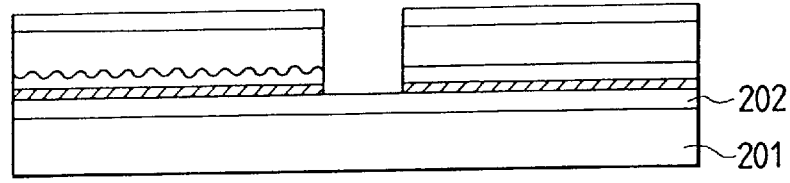

Using a selective mask 214, a phase-shifted grating 207 with a pitch of 235 nm and a depth of 50 nm is formed only on the light guide layer 204 in a region of the first semiconductor laser (see FIG. 18A). In this embodiment, it is predicted that the gain peak for the TM mode is close to 1.53 μm, and the equivalent refractive index of a final device construction is predicted to be 3.25. Hence, the grating pitch is selected to be 235 nm. Then, the selective mask 214 is removed (FIG. 18B), and a p-InP clad layer 205 and a p-InGaAs contact layer 206 are laid down over the entire wafer (FIG. 18C).

Figure 18E:
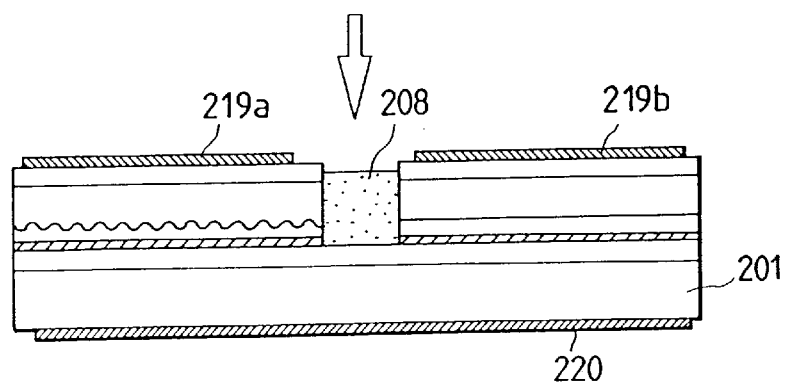

A process thereafter is a characteristic portion of the fourth embodiment. The boundary portion between the two semiconductor laser regions is removed in a slit-like form (see FIG. 18D). Here, a depth of the slit reaches the n-InP clad layer 202, and a slit gap pattern 3 is formed in a slant form relative to a waveguide direction on the side of the first semiconductor laser 1 and perpendicularly to a waveguide direction on the side of the second semiconductor laser 2 as illustrated in FIG. 17. This is for preventing reflections at the spacing portion as far as possible in the first DFB semiconductor laser 1 and for building a Fabry-Perot cavity in the second Fabry-Perot semiconductor laser region. That process can be performed by an ordinary MOCVD method and dry etching, but when that process is continuously carried out without exposing the wafer to the atmosphere in a composite processing apparatus or the like in which the RIBE apparatus is coupled to the CBE apparatus in a high vacuum manner, its reliability can be further improved. Here, when InP or the like is selected as a material 208 for filling the spacing, an epitaxial selective growth may be continuously performed (FIG. 18E). After semiconductor such as InP is epitaxially grown, an electrode is formed. Thus, the phase adjustment can be achieved by varying the amount of carriers injected through that electrode.

Then, a ridge waveguide structure with a width of 2.5 μm is formed to control the transverse mode. Its processing steps are identical with those of the third embodiment (FIG. 14). In FIG. 18E, reference numerals 219a and 219b respectively denote positive electrodes formed on an upper surface of the substrate in the first and second semiconductor lasers 1 and 2, and reference numeral 220 denotes a negative electrode. After the electrodes 219 and 220 are formed, the spacing is filled with the filler 208 having a desired refractive index. Thus, the fourth embodiment is completed (see FIG. 18E).

Figure 20A:
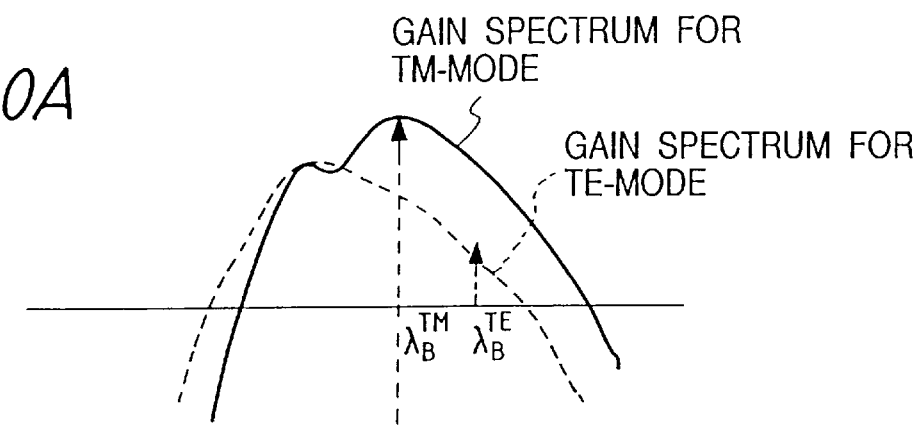
FIG. 20A is a view illustrating a manner of changes of TE-mode and TM-mode gain profiles for explaining the operation of the fourth embodiment of the present invention where the amount of injected current is small.
Figure 20B:
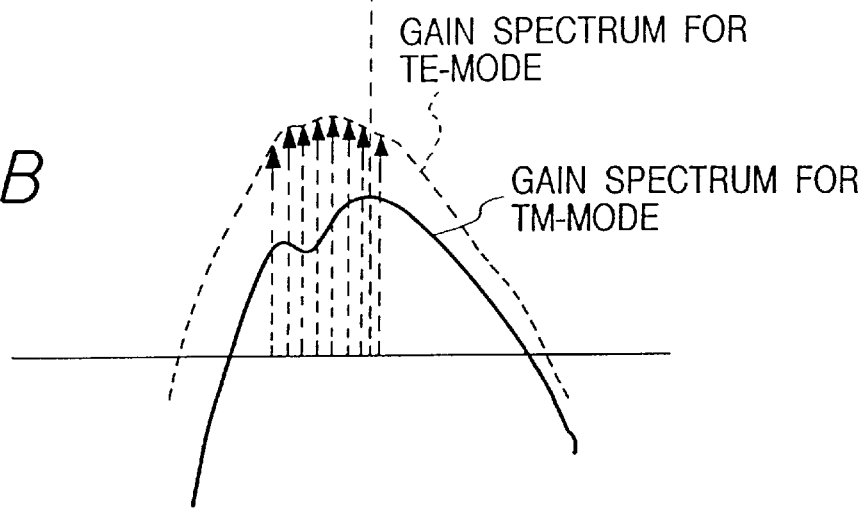
FIG. 20B is a view illustrating a manner of changes of TE-mode and TM-mode gain profiles for explaining the operation of the fourth embodiment of the present invention where the amount of injected current is large.

A driving method of the fourth embodiment will be described. FIGS. 20A and 20B show the injected-carrier-density dependency of the gain spectrum of the active layer 203 of an asymmetrical dual well structure including two different well layers. In FIG. 20A, in a state of a low injection density, the transition between light holes and electrons (an e-lh transition) is dominant and the TM-mode gain always surpasses the TE-mode gain since the filling efficiency of the first tensile-strained quantum well layer 221 on the n-side is high. Therefore, when the Bragg wavelength $\mu^{TM}_B$ for the TM mode of the grating 207 in the first DFB semiconductor laser is set close to the peak wavelength for the TM mode and the entire cavity loss is controlled such that the threshold gain is attained at that wavelength, the oscillation always occurs in a DFB mode of the TM polarization. In FIG. 20A, $\mu^{TM}_B$ and $\mu^{TE}_B$ respectively indicate Bragg wavelengths for the TM mode and the TE mode.

On the other hand, in FIG. 20B, in a state of a high injection density, the transition between heavy holes and electrons (an e-hh transition) is dominant and the TE-mode gain always surpasses the TM-mode gain since the carrier filling efficiency of the second non-strained quantum well layer 223 on the p-side is high. Therefore, when the pitch of the grating 207 and the cavity loss are controlled as discussed above, the oscillation can occur in the DFB mode of the TE polarization. However, high-precision design technology and fabrication technology are required to simultaneously tune two sets of gain spectrum and Bragg wavelength (i.e., in this state, to bring the Bragg wavelength $\mu^{TE}_B$ for the TE mode of the grating 207 in the first DFB semiconductor laser close to the peak wavelength of the TE-mode gain). In this embodiment, the Fabry-Perot cavity is used as the second semiconductor laser 2 to solve that problem. As a result, when a certain carrier density is attained, oscillation occurs in a certain Fabry-Perot mode. At this time, since no wavelength control is executed for the TE mode, the oscillation occurs in a multi-longitudinal-mode. This is not a problem because it suffices if at least one of the TE mode and the TM mode can be used for communications or the like.

For each of the two semiconductor lasers 1 and 2, however, the other cavity is a cause that disturbs the phase. So, there may be a case where it is impossible to effect the oscillation at the Bragg wavelength unless the phase is adjusted. In this case, to adjust the phases (or optical lengths) of competing light waves, the spacing formed between the two semiconductor lasers 1 and 2 is filled with the filler 208, such as gel or polymer, whose refractive index can be controlled. Thus, it is possible to achieve the polarization modulation with good yield.

In the fourth embodiment, a common active layer is used as active layers 3 of the first and second semiconductor lasers 1 and 2, but it is only for simplifying the fabrication method. As described in the third embodiment, separate active layers may be formed, and one may be used as a DFB cavity while the other may be used as a Fabry-Perot cavity. In this case, although the fabrication method becomes a little complicated, the polarization-modulation operation range can be widened.

Technical advantages of the fourth embodiment are as follows:

(1) The fabrication process is simple since the active layer can be formed at one time;
(2) The fabrication process is simple because one of the semiconductor lasers has no grating and a very simple electrode stripe can be used therein;
(3) Even if the phase of light does not match, the adjustment of the phase can be readily performed; and
(4) The polarization switchable operation range is wide.

Fifth Embodiment

A fifth embodiment is directed to an array of polarization selective or switchable lasers with the same characteristics.

Figure 32:
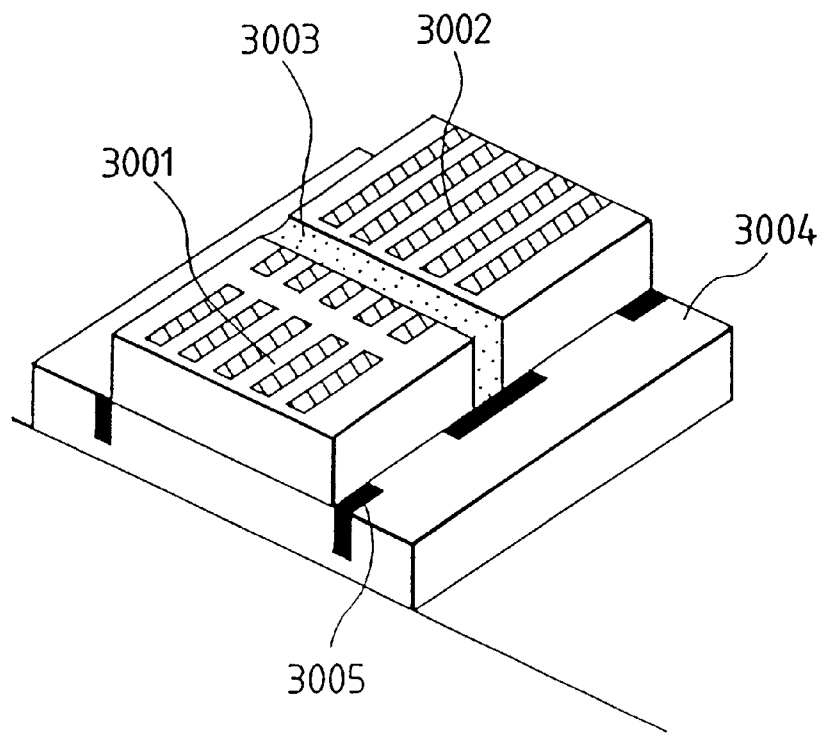
FIG. 32 is a perspective view illustrating a fifth embodiment of the present invention.

FIG. 32 illustrates the fifth embodiment. In FIG. 32, reference numeral 3001 denotes a first semiconductor laser array, reference numeral 3002 designates a second semiconductor laser array, reference numeral 3003 denotes a spacing and/or a filler filling the spacing, reference numeral 3004 designates;a heat sink, and reference numeral 3005 denotes a marker. The semiconductor laser arrays are disposed on the heat sink 3004 mounted on a sub-carrier (not shown). The semiconductor laser arrays may be mounted directly on the sub-carrier.

Figure 33:
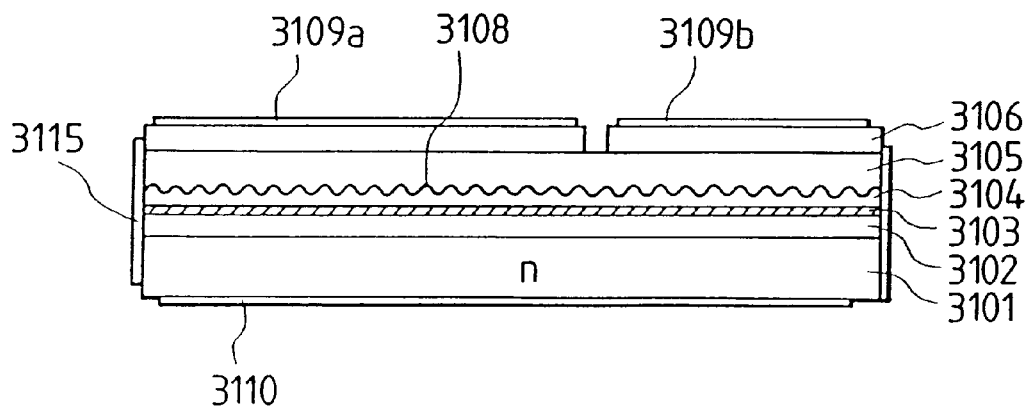
FIG. 33 is a cross-sectional view taken along a cavity direction of a semiconductor laser array structure for explaining the fifth embodiment of the present invention.
Figure 34:
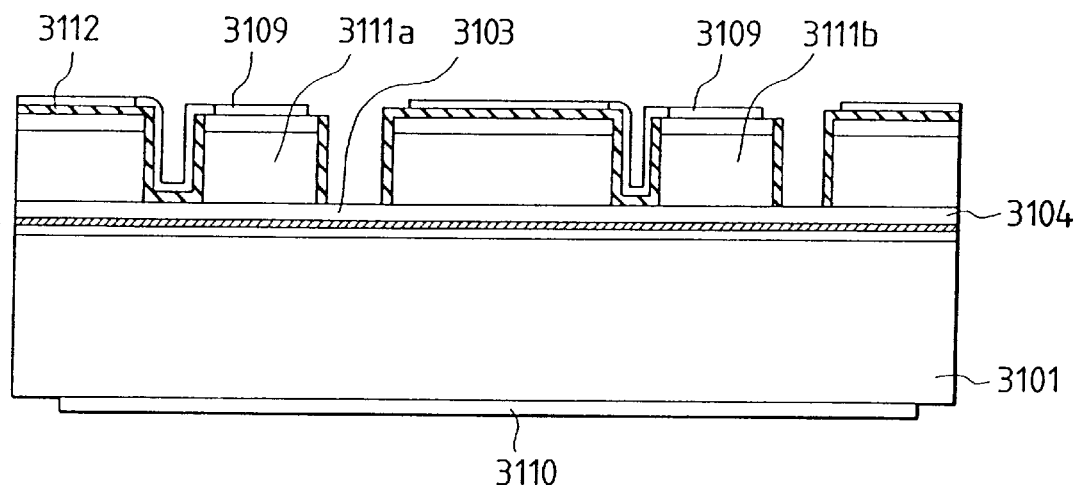
FIG. 34 is a cross-sectional view taken along a direction perpendicular to the cavity direction of the semiconductor laser array structure for explaining the fifth embodiment of the present invention.
Figure 35:
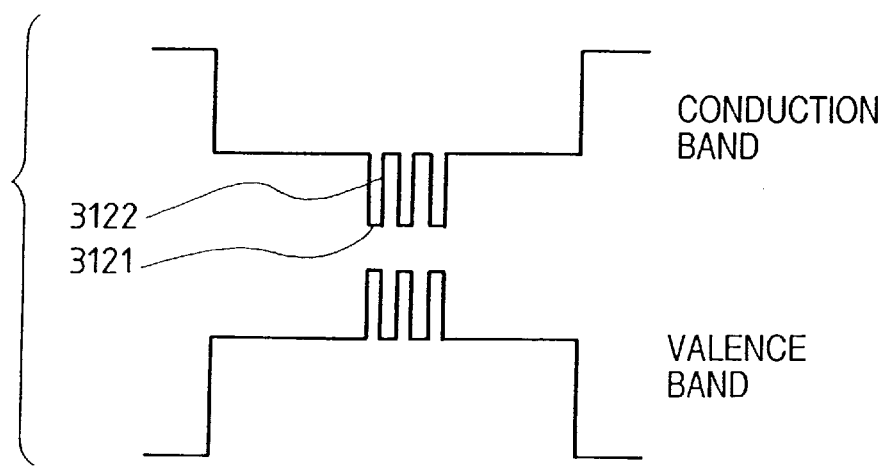
FIG. 35 is a view for explaining the band gap structure of one active layer in the fifth embodiment of the present invention.

A fabrication method of the semiconductor laser array will be initially described. FIG. 33 is a cross-sectional view taken along a direction including an oscillation axis of the first semiconductor laser. FIG. 34 is a cross-sectional view taken along a direction perpendicular to the direction of FIG. 33. On an n-type (100) InP substrate 3101, an n-InP clad layer 3102, an undoped active layer 3103 and a p-InGaAsP light guide layer 3104 are laid down using the MOCVD method or the CBE method. FIG. 35 is the band diagram of the active layer 3103 with separate confinement heterostructure (SCH) layers formed on upper and lower sides thereof. In FIG. 35, reference numeral 3121 denotes a tensile strained InGaAs well layer formed with the amount of a tensile strain of 0.9% and a thickness of 9 nm, and reference numeral 3122 denotes a non-strained InGaAsP barrier layer formed with a band gap of 0.99 eV and a thickness of 10 nm.

The number of the well layers 3121 is three (3).

Then, a phase-shifted grating 3108 is formed with a pitch of 325 nm and a depth of 50 nm over the entire wafer, and a p-InP clad layer 3105 and a p-InGaAs contact layer (cap layer) 3106 are deposited on the grating 3108. Reference numeral 3115 designates an antireflection (AR) coat provided on each of both opposite end facets of the device for reducing reflection on the end facet.

As illustrated in FIG. 34, waveguide structures with a width of 2.5 μm are formed with intervals of 100 pm for control of their transverse modes. In FIG. 34, reference numeral 3111a and 3111b respectively denote ridge type light waveguides (actually, similar structures are formed on both sides thereof), and reference numeral 3112 denotes an insulating film, such as a $SiO_x$, for preventing a current flow into portions other than the ridge portion. Further, reference numeral 3109 denotes a positive electrode formed on an upper surface of the substrate (as illustrated in FIG. 33, the positive electrode 3109 is separated into two portions 3109a and 3109b arranged in the cavity direction), and reference numeral 3110 designates a negative electrode on the bottom side of the substrate. In this embodiment, the positive electrode 3109 is divided into two portions (in this case, the distribution of injected carriers can be controlled and the polarization-modulation operation range can be expanded), but it may be a single electrode. In FIG. 34, layer structures projecting between the plural ridge-type light waveguides 3111 are not what are needed functionally, but those structures have been only formed as a result of an etching process for forming the ridge-type light waveguides 3111a, 3111b, . . . .

A tensile-strained multiple quantum well structure is used as the active layer 3103 and the Bragg wavelength of each semiconductor laser structure of the array 3001 is set close to its gain peak wavelength by appropriately setting the pitch of the grating 3108 and the like. As a result, the TM-mode gain always surpasses the TE-mode gain, so that oscillation always occurs in a DFB mode of the TM polarization. In this embodiment, the grating 3108 is formed after the active layer 3103 is grown since the formation precision of the grating is presently considered to be technically superior to the wavelength controllability of crystalline growth (i.e., it is considered to be favorable that after the active layer is grown and its gain peak wavelength is determined, the pitch of the grating and the like are determined according to the gain peak wavelength). If both of them can be fabricated with high precision, the active layer and the like may be formed after the grating is formed directly on the substrate. This is also true in the other embodiments of the laser array.

Next, a fabrication method of the second semiconductor laser array 3002 will be described. In the fifth embodiment, layer thicknesses and compositions of the second semiconductor laser array 3002 are controlled such that the propagation constant for the TE mode in the first semiconductor laser array 3001 is about equal to that in the second semiconductor laser array 3002. Fundamentally, the structures other than the active layers may be approximately the same between the first and second semiconductor laser arrays 3001 and 3002. The transverse mode of the second semiconductor laser array 3002 is also controlled using the ridge structure, but its width is not necessarily equal to that of the first semiconductor laser array 3001. When the widths of the ridge structures of the first and second semiconductor laser arrays 3001 and 3002 are different from each other, the propagation constants of the both semiconductor laser arrays 3001 and 3002 only need to be made equal to each other by modifying other structural parameters in accordance with the difference in the widths of the ridge structures. The pitch of the ridges in the second semiconductor laser array is accurately set to 100 μm to be accorded to the pitch in the first semiconductor laser array 3001. Thus, each semiconductor laser structure in the first semiconductor laser array 3001 and each semiconductor laser structure in the second semiconductor laser array 3002 are paired, and the respective pairs constitute a plurality of semiconductor lasers.

Figure 36:
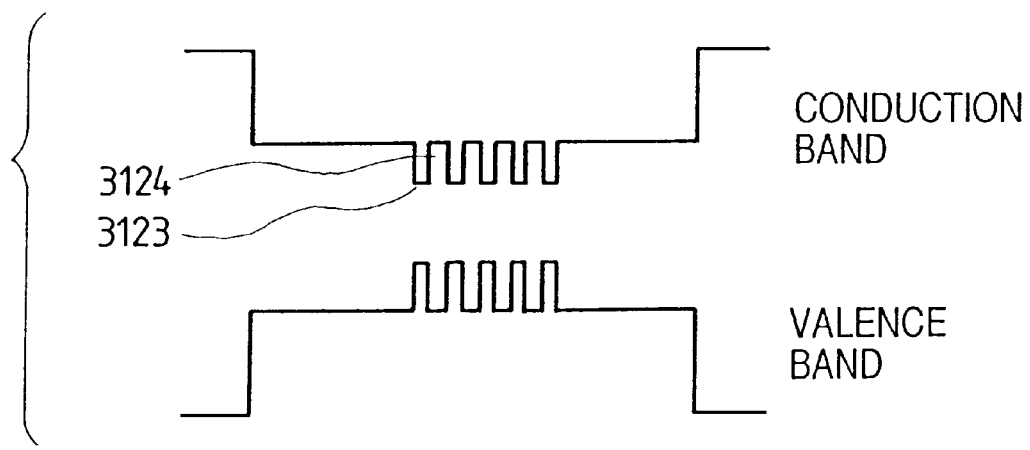
FIG. 36 is a view for explaining the band gap structure of the other active layer in the fifth embodiment of the present invention.

FIG. 36 illustrates the band diagram structure of the active layer in the second semiconductor laser array 3002 (SCH layers are respectively formed on upper and lower sides of the active layer). Reference numeral 3123 denotes a non-strained InGaAs well layer formed with a thickness of 7.5 nm, and reference numeral 3124 denotes a non-strained InGaAsP barrier layer formed with a band gap of 0.99 eV and a thickness of 10 nm. The number of the well layers 3123 is five (5). As a result, a transition between heavy holes and electrons becomes dominant, and the TE-mode gain always excels the TM-mode gain. Further, since the Bragg wavelength of each semiconductor laser in the second semiconductor laser array 3002 is set close to the peak wavelength of the TE-mode gain, oscillation always occurs in a DFB mode of the TE polarization.

In order that each first semiconductor laser and each second semiconductor laser of the first and second semiconductor laser arrays 3001 and 3002 can readily constitute a composite cavity, it is desirable that reflectance at both opposite end facets (especially, opposed end facets) are as low as possible. In this embodiment, AR coats are formed on all of the end facets. Further, since it is predicted that a difference in the polarization switchable operation range appears depending on the cavity length, it is determined desirable one is selected from different arrays with several cavity lengths. Thus, structures of the first and second semiconductor laser arrays 3001 and 3002 can be readily controlled independently. Or, a desirable array can be selected from plural arrays fabricated beforehand. That is one of important features of the present invention.

Next, a method for mounting the two semiconductor laser arrays 3001 and 3002 on the heat sink 3004 will be described with reference to FIG. 32. For example, the first semiconductor laser array 3001 is die-bonded to a desired position indicated by the marker 3005 with its epi-side being down or up (in FIG. 32, the epitaxial layer side is up). The position of the second semiconductor laser array 3002 is adjusted by oscillating a portion or all of the second semiconductor laser structures with a pulsative current driving and causing the semiconductor laser structures of the first semiconductor laser array 3001 to function as a waveguide type photodetector. Since the positional adjustment is conducted using plural points of the semiconductor laser array, the positional adjustment can be more readily and more accurately effected than the case of a single semiconductor laser. After the positional adjustment of the second semiconductor laser array 3002 is completed, the semiconductor laser structures of the first semiconductor laser array 3001 are in turn driven in a pulsative manner and the semiconductor laser structures of the second semiconductor laser array 3002 are caused to function as a photodetector. After confirming light reception by the second semiconductor laser structures, the second semiconductor laser array 3002 is die-bonded. As a result, the paired semiconductor laser structures of the two semiconductor laser arrays 3001 and 3002 are fixed to the heat sink 3004 in an optimum optically-coupled state. Though the coupling efficiency of optical power is large, the size of the spacing 3003 formed between the two semiconductor laser arrays 3001 and 3002 is somewhat difficult to control and hence the phase tends to shift. Therefore, it can be considered that the polarization modulation or switching is hard to achieve or the device only operates in one of the TE mode and the TM mode. To solve this problem, the spacing formed between the two semiconductor laser arrays 3001 and 3002 is filled with material 3003, such as gel, polymer or compound semiconductor, which has a desired refractive index thereat. Thus, it is possible to achieve the polarization modulation with good yield. When the phase matching condition differs between the respective paired semiconductor laser structures, the spacing 3003 may be filled with liquid crystal (LC) in place of the gel and the polymer. Its refractive index or transmissivity can be varied by applying a voltage across the LC through each electrode formed thereon. Alternatively, the phase can be finely adjusted by providing a phase control region in each semiconductor laser structure and adjusting the amount of carriers injected therein.

Figure 37:
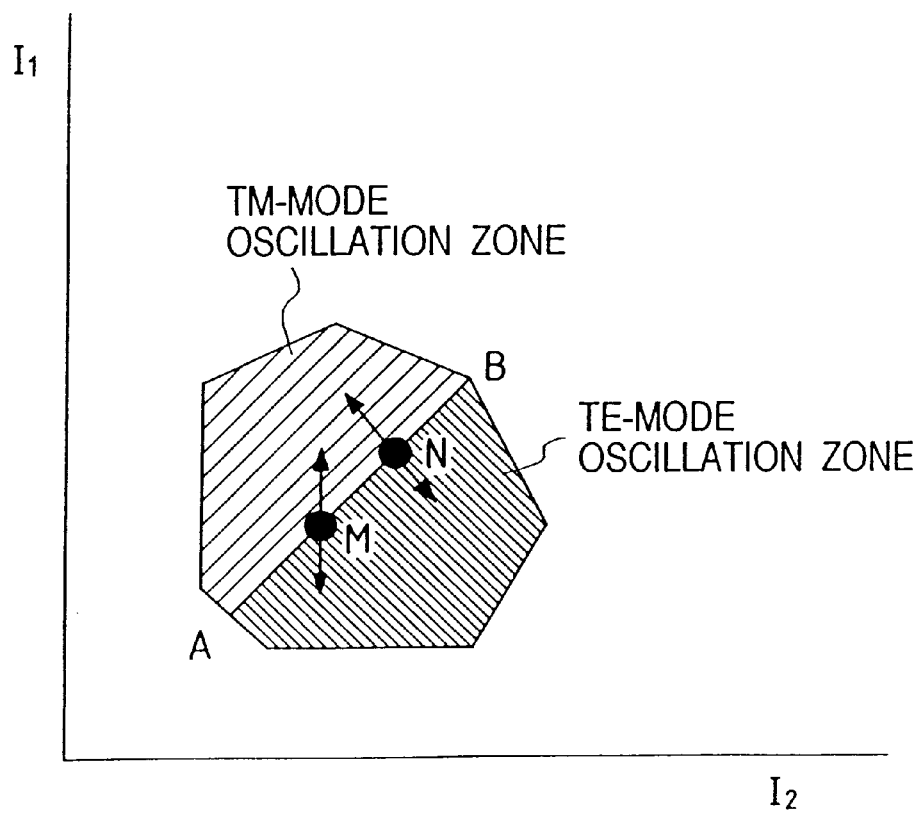
FIG. 37 is a graph illustrating the relationship between amounts of currents injected into two semiconductor laser structures and an oscillation polarization mode of the fifth embodiment.

The operation of the fifth embodiment will be described. FIG. 37 shows the distribution of the polarization mode at the time currents (I1 and I2) are independently injected into the TM-mode region (in the first semiconductor laser array 3001) and the TE-mode region (in the second semiconductor laser array 3002) of the paired semiconductor laser structures constituting the first and second semiconductor laser arrays 3001 and 3002. Its boundary line A–B indicates that threshold gains for the TE mode and the TM mode are approximately equal to each other. When a modulation signal is superimposed with that boundary line being a bias point (for example, a point M or N), the oscillation polarization mode can be switched or the polarization modulation can be achieved. There are illustrated a case where the modulation signal is only superimposed on I1 with the bias point being set at the point M, and a case where the modulation signals with opposite phases to each other are superimposed on I1 and I2 with the bias point being set at the point N. Here, since the modulation current is at most 1 mA, the chirping is oppressed and a delay in oscillation start times (so-called skew) among the semiconductor lasers each composed of the paired semiconductor laser structures is markedly reduced. Further, when the positive electrode of at least one of the semiconductor laser structures in the semiconductor laser arrays 3001 and 3002 is divided into two electrodes 3109a and 3109b, the phase of light in each polarization mode can be finely adjusted by unevenly injecting carriers through those positive electrodes. Thus, the polarization-modulation operation range can be further expanded.

Technical advantages of the fifth embodiment are as follows:

(1) Semiconductor laser arrays for the TE mode and the TM mode can be independently and separately optimized;

(2) Appropriate semiconductor laser arrays can be selected from a plurality of semiconductor laser arrays of the same kind in order to build the above-discussed construction;

(3) Both of the TE-mode light and the TM-mode light can be used for optical communications or the like since both of them have good qualities about line widths and the like;

(4) Even if the phase of light does not match, the adjustment of the phase can be readily performed by adjusting the spacing, the filler or the like; and (5) Since the modulation current is small, the skew is very small and hence the modulation speed and transmission distance can be improved.

In the fifth embodiment, transverse modes of the two semiconductor laser arrays 3001 and 3002 are controlled by the ridge structure. However, confinement structure in the transverse direction is not limited to the ridge structure, but other structures, such as a burying structure, that have been used in conventional semiconductor lasers, can also be employed.

Sixth Embodiment

Figure 38:
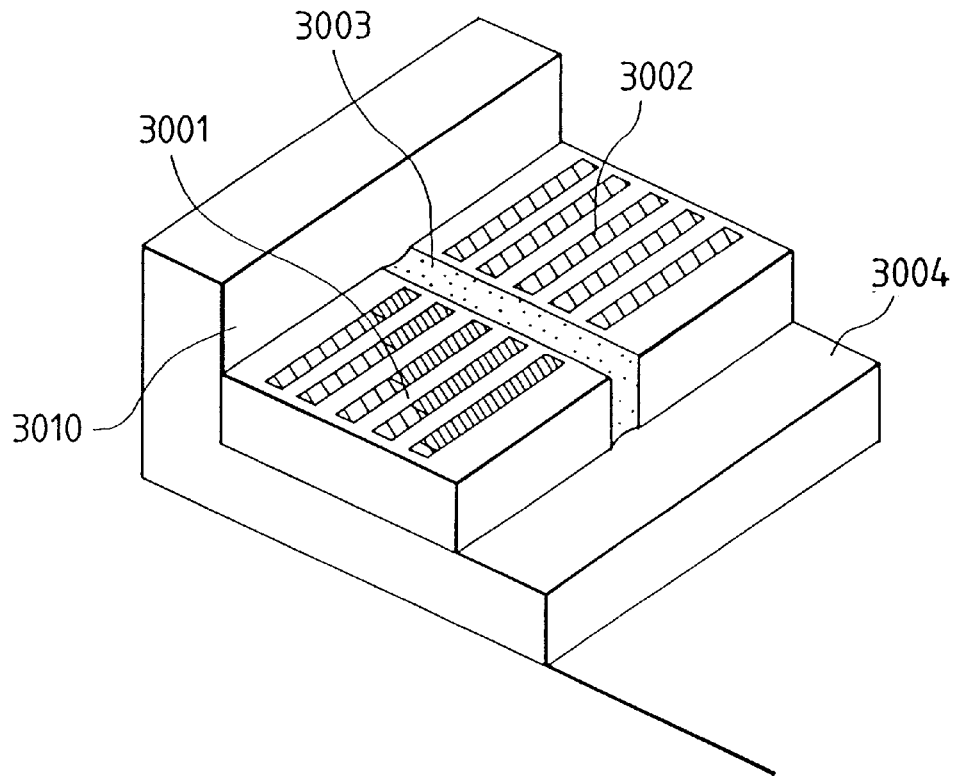
FIG. 38 is a perspective view illustrating sixth and seventh embodiments of the present invention.
Figure 42:
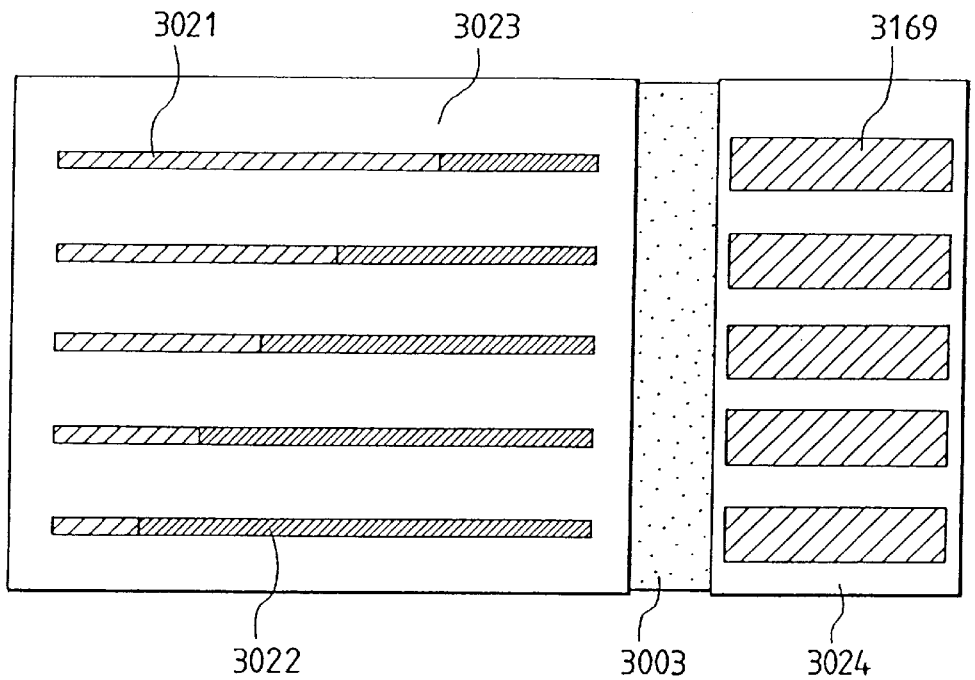
FIG. 42 is a plan view illustrating a semiconductor laser array of the sixth and seventh embodiments of the present invention.

A sixth embodiment is directed to a multi-wavelength polarization selective semiconductor laser array which can be very easily fabricated and in which oscillation wavelengths of respective semiconductor lasers vary. FIG. 38 illustrates its schematic structure, and FIG. 42 is its plan view. In FIG. 42, reference numeral 3023 denotes a semiconductor laser array for the TM mode, reference numeral 3024 designates a semiconductor laser array for the TE mode, reference numeral 3022 denotes a DBR region in each laser structure of the semiconductor laser array 3023 for the TM mode, reference numeral 3021 denotes a TM-mode gain region in each laser structure of the semiconductor laser array 3023 for the TM mode, and reference numeral 3003 designates a spacing and/or a filler.

The sixth embodiment differs from the fifth embodiment in the following points:

(1) An array of semiconductor laser structures of different oscillation wavelengths each having a distributed Bragg reflection (DBR) type reflector is used as a first semiconductor laser array 3001;

(2) An array of Fabry-Perot semiconductor lasers is used as a second semiconductor laser array 3002; and (3) A heat sink (or a support member such as a sub-carrier) with an abutment surface 3010 perpendicular to a surface, to which the laser is to be fixed, is used.

Figure 39:
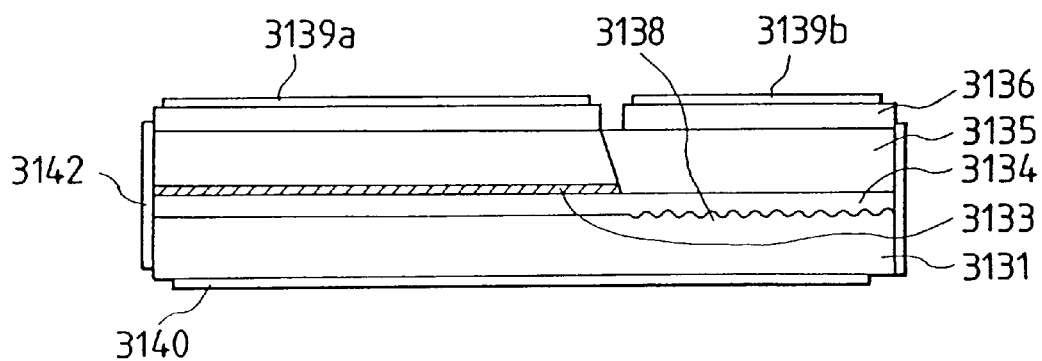
FIG. 39 is a cross-sectional view taken along a cavity direction of a DBR type semiconductor laser array structure for explaining the sixth embodiment of the present invention.

A fabrication method of the first semiconductor laser array 3001 will be initially described. FIG. 39 illustrates a cross section of the first semiconductor laser array 3001 including its oscillation axis, and a cross section thereof perpendicular to the cross section of FIG. 39 is the same as that of the fifth embodiment (see FIG. 34). In the fabrication method, after ten grating regions with gratings 3138 of pitches of 325 nm to 328.6 nm (an interval of 0.4 nm therebetween) are formed at intervals of 10 nm on a DBR region of an n-type (100) InP substrate 3131, an n-InGaAsP light guide layer 3134 and an undoped active layer 3133 are deposited using the MOCVD method or the CBE method, Then, after the active layer 3133 in the DBR region is removed, a p-InP clad layer 3135 and a p-InGaAs contact layer 3136 are laid down thereover.

Figure 40:
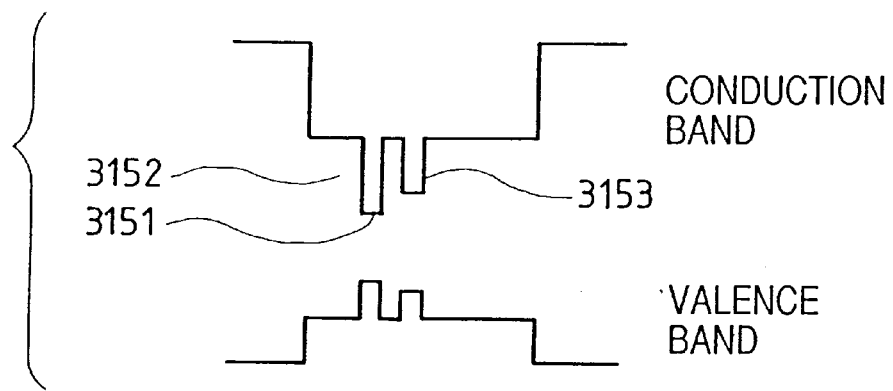
FIG. 40 is a view for explaining the band gap structure of one active layer in the sixth embodiment of the present invention.

FIG. 40 is the band diagram of the active layer 3133. In FIG. 40, reference numeral 3151 denotes a tensile strained InGaAsP first well layer formed with the amount of a tensile strain of 0.9% and a thickness of 9 nm, reference numeral 3152 denotes a non-strained InGaAsP barrier layer formed with a band gap of 0.99 eV and a thickness of 1 nm, and reference numeral 3153 denotes a tensile strained InGaAsP second well layer formed with the amount of a tensile strain of 0.7%, a band gap of 0.75 eV and a thickness of 10 nm.

Similar to the fifth embodiment, a plurality of ridge waveguide structures with a width of 2.5 μm are formed at intervals of 100 μm to control the transverse mode (see FIG. 34). In FIG. 39, reference numerals 3139a and 3139b respectively denote positive electrodes, reference numeral 3140 denotes a negative electrode and reference numeral 3142 designates an AR coat formed on each of opposite end facets.

Figure 41:
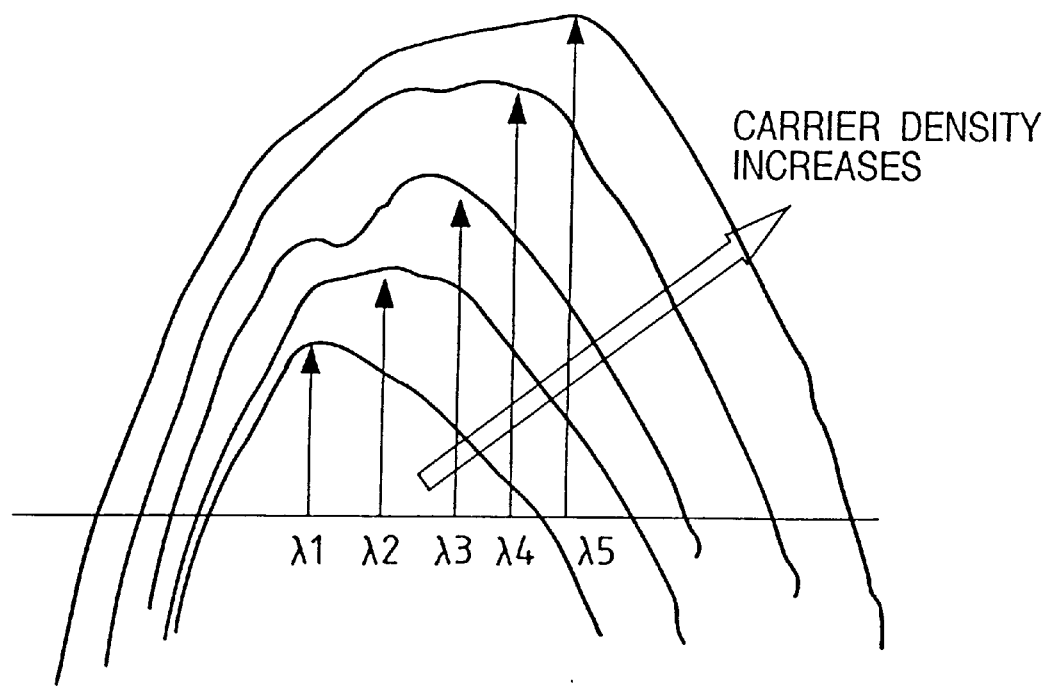
FIG. 41 is a view illustrating a manner of a change of gain profiles for one active layer for explaining the operation of the sixth embodiment of the present invention.

Since the asymmetrical strained quantum well structure is used as the active layer 3133 as illustrated in FIG. 40, its gain spectrum is largely different from that of an ordinary non-strained multiple quantum well active layer. First, since a tensile strain is introduced into each of the well layers 3151 and 3152, a transition between electrons and light holes is dominant and the TM-mode gain always surpasses the TE-mode gain at the peak wavelength. Second, since thicknesses and compositions of the well layers are asymmetrical with each other, a ground level differs between the two well layers and the gain spectrum is greatly changed by the amount of carriers injected therein. FIG. 41 schematically illustrates a typical TM-mode gain spectrum of the first semiconductor laser array 3001 of this embodiment with the density of injected carriers being its parameter. As the amount of injected carriers increases, the magnitude of the peak increases and the peak wavelength position shifts to a longer wavelength side. Therefore, when the Bragg wavelength of each semiconductor laser structure in the first semiconductor laser array 3001 is set at each position indicated by arrows in FIG. 41 (by setting pitches of the gratings 3138, for example) and the magnitude of loss is controlled, there can be obtained the TM-mode semiconductor laser array in which oscillation wavelengths vary from each other, wavelength stability is high and oscillation always occurs in the TM mode. In this embodiment, as a method of controlling the loss, a method of increasing the threshold gain by decreasing the size of the gain region 3021 is used (see FIG. 42). In the sixth embodiment, although a DBR laser with;an ordinary DBR region without any gain is used, such a DBR laser structure as has an active layer in its DBR region can be adopted. Both of the wavelength and the threshold gain can be controlled by controlling the amounts of currents injected into the gain region 3021 and the DBR region 3022.

Figure 44:
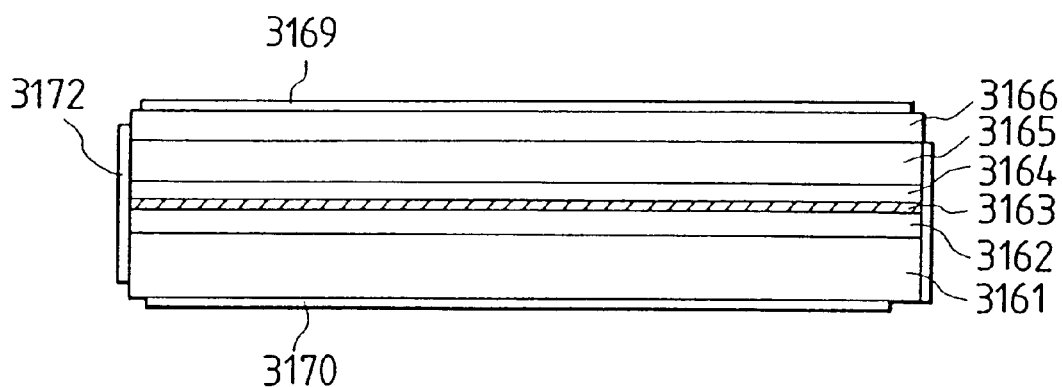
FIG. 44 is a cross-sectional view taken along a cavity direction of a Fabry-Perot type semiconductor laser array structure for explaining the sixth embodiment of the present invention.
Figure 45:
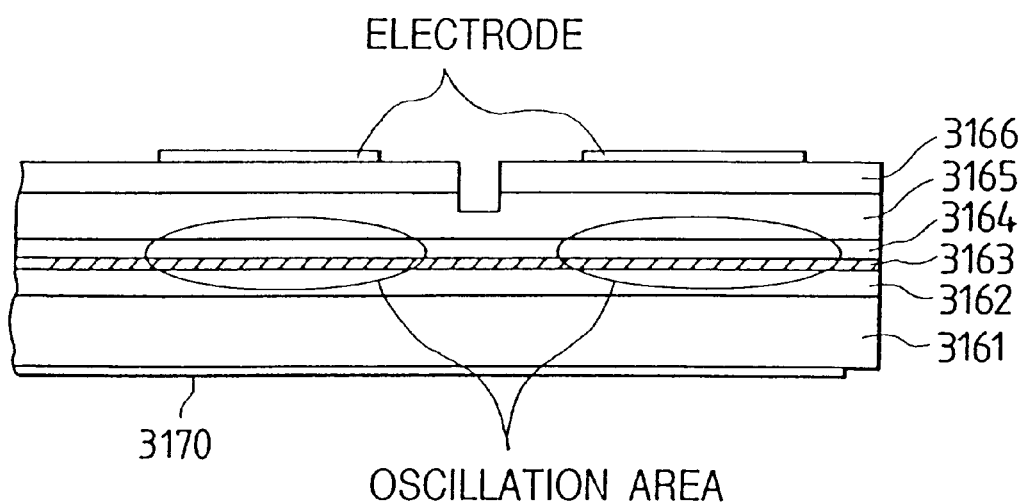
FIG. 45 is a cross-sectional view taken along a direction perpendicular to the cavity direction of the Fabry-Perot type semiconductor laser array structure for explaining the sixth embodiment of the present invention.

A fabrication method of the second semiconductor laser array 3002 will be described. FIG. 44 illustrates a cross section of the second semiconductor laser array 3002 including its oscillation axis, and FIG. 45 illustrates a cross section thereof perpendicular to the cross section of FIG. 44. In the fabrication method, on an n-type (100) InP substrate 3161, an n-InP clad layer 3162, an undoped active layer 3163, an n-InGaAsP light guide layer 3164, a p-InP clad layer 3165 and a p-InP contact layer 3166 are deposited. The structure of the active layer 3163 is the same as that of the second semiconductor laser array in the fifth embodiment (see FIG. 36). In the sixth embodiment, however, no control of the transverse mode is intentionally executed. For example, electrode stripes 3169 with a width of 50 μm are only formed at intervals of 100 μm. As a result, oscillation always occurs in the TE mode. This mode is always a Fabry-Perot multi-mode of the TE mode since no grating is formed and no mechanism for controlling the transverse mode is arranged, differently from the fifth embodiment. Reference numeral 3169 designates an electrode formed on the cap layer 3166, reference 3170 designates an electrode on the bottom side of the substrate, and reference numeral 3172 designates an AR coat.

Next, optical coupling between the two semiconductor laser arrays 3001 and 3002 will be described. Reflectance at opposed end facets of the first and second semiconductor laser arrays 3001 and 3002 is desirably as low as possible. For that purpose, AR coats 3142 and 3172 are respectively formed on the end facets of the lasers as illustrated in FIGS. 39 and 44. Further, during the fabrication, widths of the first and second semiconductor laser arrays are made substantially equal to each other, and their side surfaces are desirably made as a cleaved surface since those side faces are brought into contact with the perpendicular face 3010 of a heat sink 3004.

In FIG. 38, there is formed on the heat sink 3004 the surface 3010 which is perpendicular to the surface for fixing the semiconductor laser thereon. The semiconductor laser arrays 3001 and 3002 are respectively positioned by abutting chip side faces thereof against the perpendicular surface 3010 of the heat sink 3004.

In the case of the sixth embodiment, there is necessarily no need to perform the active alignment as is carried out in the fifth embodiment. Markers (not shown) are beforehand provided on the heat sink 3004 and the laser chips 3001 and 3002, respectively, and a sufficient precision can be achieved by aligning those markers with each other while looking to them (passive alignment). That is, in the sixth embodiment, the positional alignment of light waveguides in the two semiconductor laser arrays 3001 and 3002 is only conducted by the positional alignment in a direction perpendicular to the cleaved facet of the chip. This is due to the fact that a degree of freedom in alignment of the optical axis in the transverse direction is increased since the semiconductor laser structure with a wide electrode stripe structure is used as the second semiconductor laser array 3002. If necessary, the same active alignment as that conducted in the fifth embodiment may be used in part.

It is a marked feature of the sixth embodiment that the optical-axis adjustment is very readily performed since the Fabry-Perot semiconductor laser array 3024 for the TE mode is used as discussed above. A driving method of the sixth embodiment will be described. The TM-mode semiconductor laser array 3023 oscillates in the TM mode and the TE-mode semiconductor laser array 3024 oscillates in the TE mode. This is the same as the fifth embodiment. In this embodiment, however,-since the oscillation in the TE mode is the Fabry-Perot multi-mode, the condition, under which the threshold gain is the same between the TE mode and the TM mode, is more moderate than that of the fifth embodiment. This results in a wide polarization-modulation operation range (in connection therewith, also see the description of a seventh embodiment to be described later).

Figure 43:
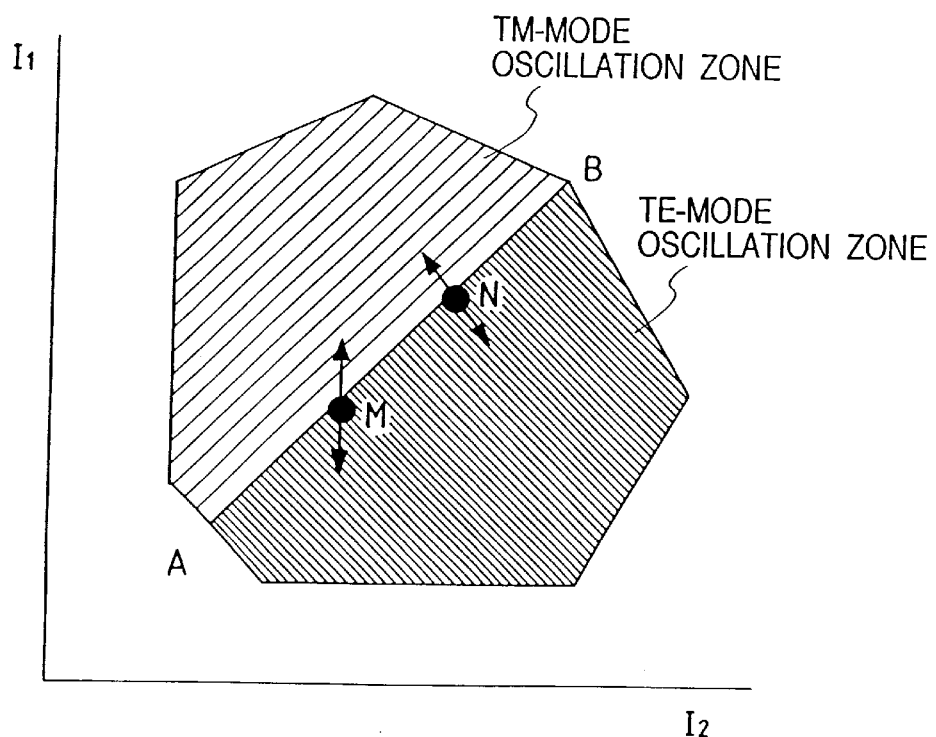
FIG. 43 is a graph illustrating the relationship between amounts of currents injected into two semiconductor laser structures and an oscillation polarization mode of the sixth embodiment.

FIG. 43 shows the distribution of the oscillation polarization mode at the time when currents (I1 and I2) are independently injected into the paired laser structures in the first and second semiconductor laser arrays 3001 and 3002. Its boundary line A–B indicates that threshold gains for the TE mode and the TM mode are approximately equal to each other. When a modulation signal is superimposed with that boundary line being a bias point (for example, a point M or N), the oscillation polarization mode can be switched or the polarization modulation can be achieved. The bias zone, in which the polarization modulation is possible, is wide, compared with the fifth embodiment, since the Fabry-Perot semiconductor laser array is used as one of two semiconductor laser arrays in the sixth embodiment. That is, control ranges for light output and oscillation wavelength are wide.

Technical advantages of the sixth embodiment are as follows:

(1) The cost of this embodiment is relatively low since the TE-mode laser may be a simple laser with an electrode stripe;

(2) A multi-wavelength polarization selective semiconductor laser array can be readily achieved;

(3) A Fabry-Perot semiconductor laser array is used as one of the two lasers, so that the optical-axis alignment between the two semiconductor lasers can be readily performed;

(4) Even if the phase of light does not match, the matching of the phase can be readily performed by filling the spacing with the filler 3003 whose refractive index can be controlled, for example; and (5) The polarization modulation operation range is wide since operation conditions of the Fabry-Perot semiconductor laser are not strict.

Seventh Embodiment

A seventh embodiment is directed to a multi-wavelength polarization selective semiconductor laser array in which both semiconductor laser arrays are formed on a common substrate and their oscillation wavelengths vary from each other. The entire construction is as illustrated in FIGS. 38 and 42.

The design principle of this embodiment is as follows:

(1) A first semiconductor laser array 3001 includes a common active layer, in which the TM-mode gain is dominant, and distributed Bragg reflectors (DBRs) with different Bragg wavelengths;

(2) A second semiconductor laser array 3002 includes a common active layer, in which the TE-mode gain is dominant, and Fabry-Perot cavities;

(3) Threshold gains (or cavity losses) of respective lasers in the first semiconductor laser array 3001 are controlled by sizes of the active regions 3021 and DBR regions 3022; and (4) Each laser in the second semiconductor laser array has the same structure and a common threshold gain.

Figure 46:
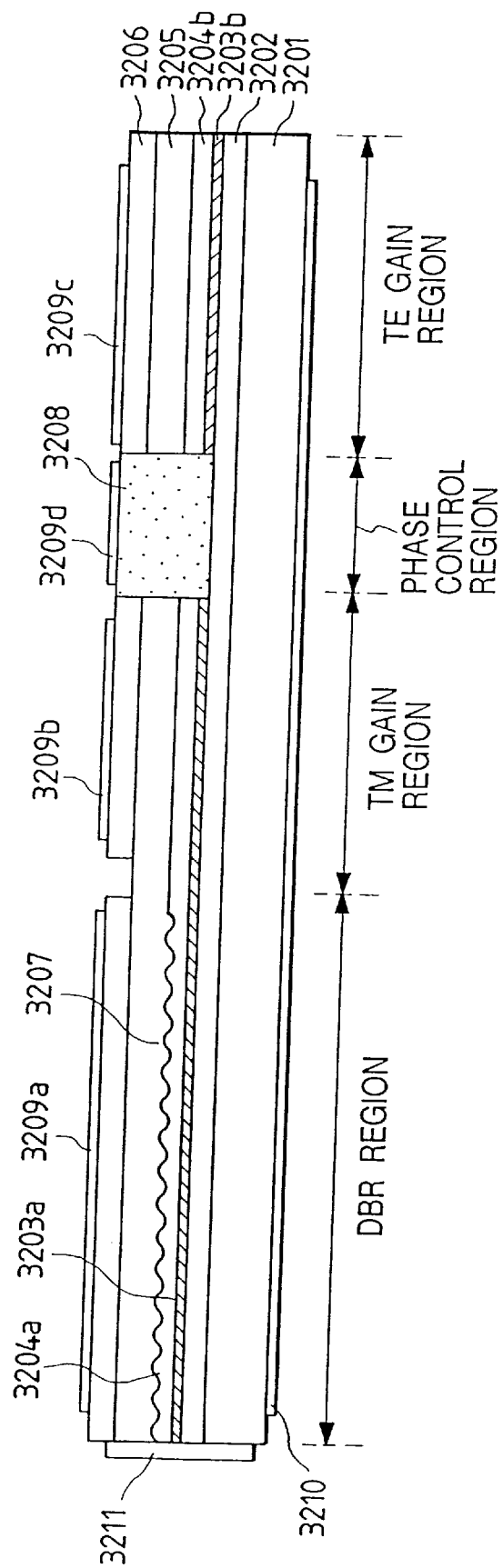
FIG. 46 is a cross-sectional view taken along a cavity direction of a polarization selective semiconductor laser array for explaining the seventh embodiment of the present invention.

A fabrication method of the first semiconductor laser array 3001 will be initially described. FIG. 46 illustrates cross sections of the first and second semiconductor laser arrays 3001 and 3002 including their oscillation axes. A cross section thereof perpendicular to the cross section of FIG. 46 is about the same as that of the fifth embodiment (see FIG. 34).

In the fabrication method of the seventh embodiment, on an n-type (100) InP substrate 3201, after an n-type InP clad layer 3202 is formed, an undoped active layer 3203a and a p-InGaAsP light guide layer 3204a are laid down only on a region of the first semiconductor laser array using a selective mask. A growth method at this time is appropriately the MOCVD method or the CBE method. Here, abnormal or irregular growth is likely to occur near the mask edge portion, but it may;be left without any processing.

Figure 47:
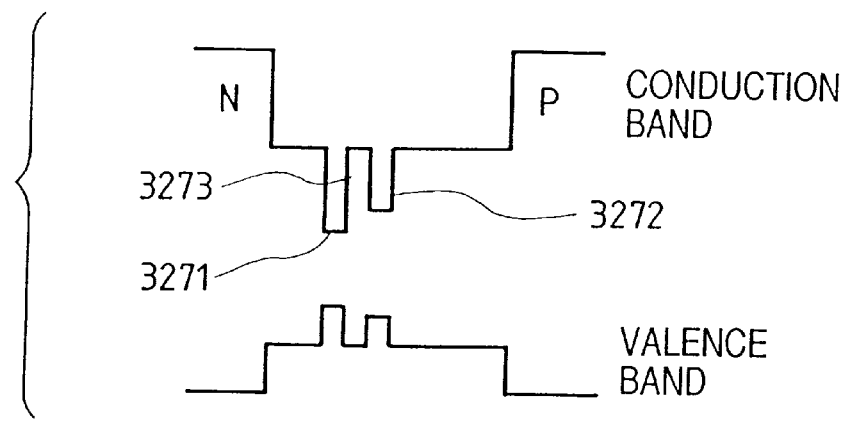
FIG. 47 is a view for explaining the band gap structure of one active layer in the seventh embodiment of the present invention.

FIG. 47 is the band diagram of the active layer 3203a. In FIG. 47, reference numeral 3271 denotes a tensile strained InGaAs first well layer formed with the amount of a tensile strain of 0.9% and a thickness of 9 nm, reference numeral 3273 denotes a non-strained InGaAsP barrier layer formed with a band gap of 0.99 eV and a thickness of 10 nm, and reference numeral 3272 denotes a tensile strained InGaAs second well layer formed with the amount of a tensile strain of 0.7%, a band gap of 0.8 eV and a thickness of 10 nm.

In the fabrication method, ten grating regions with gratings 3207 of pitches of 325 nm to 328.6 nm (an interval of 0.4 nm therebetween) with a depth of 50 nm are formed at intervals of 100 μm only on a DBR region of the light guide layer 3204a. In this embodiment, no grating is formed on the TM-mode gain region. Lengths of the DBR region and the TM-mode gain region in the cavity direction are gradually varied as illustrated in FIG. 42. This is for varying the threshold gains of the respective semiconductor lasers.

Then, the selective mask is removed, and a new selective mask is formed covering the region of the first semiconductor laser array. After that, a second active layer 3203b and a second light guide layer 3204b are selectively grown on the InP clad layer 3202 thinly formed as a buffer layer. Also in this case, abnormal growth is likely to appear near the edge, but it may be left as it is. In the structure of the second active layer 3203b, it is desirable that the TE-mode is large and the gain spectrum is flat. Here, an undoped InGaAsP layer with a band gap wavelength of 1.53 μm and a thickness of 500 nm is used.

After the selective mask is removed, a p-InP clad layer 3205 and a p-InGaAs contact layer 3206 are laid down over the entire wafer.

Then, a boundary portion between the two semiconductor laser array regions is removed in a slit-like form. Here, the depth of the slit reaches the n-InP clad layer 3202, and the slit pattern is formed in a slant form relative to a waveguide direction on the end facet side of the first semiconductor laser array 3001 and perpendicularly to the waveguide direction on the end facet side of the second semiconductor laser array 3002. This is for preventing reflections at a spacing portion 3208 as far as possible for the first semiconductor laser array 3001, and for forming the Fabry-Perot cavity for the second semiconductor laser array region. That process can be performed by an ordinary MOCVD method and dry etching, but when that process is continuously carried out without exposing the wafer to the atmosphere in a composite processing apparatus in which the RIBE apparatus is coupled to the CBE apparatus in a high vacuum manner, the reliability can be further improved.

As illustrated in FIG. 34, a plurality of transverse-mode waveguides are formed at intervals of 100 μm, and a plurality of ridge waveguides with a width of 10 μm are formed in the region of the TM-mode semiconductor laser array. In the second semiconductor laser array 3002, an electrode stripe with a width of 10 μm is formed such that all of the lasers have the same threshold gain. Finally, electrodes 3209a–3209d and 3210 are formed such that carriers can be independently injected into the DBR region, TM-mode gain region, phase control region and TE-mode gain region. Reference numeral 3211 denotes an AR coat formed on the end facet of the DBR laser.

Figure 48:
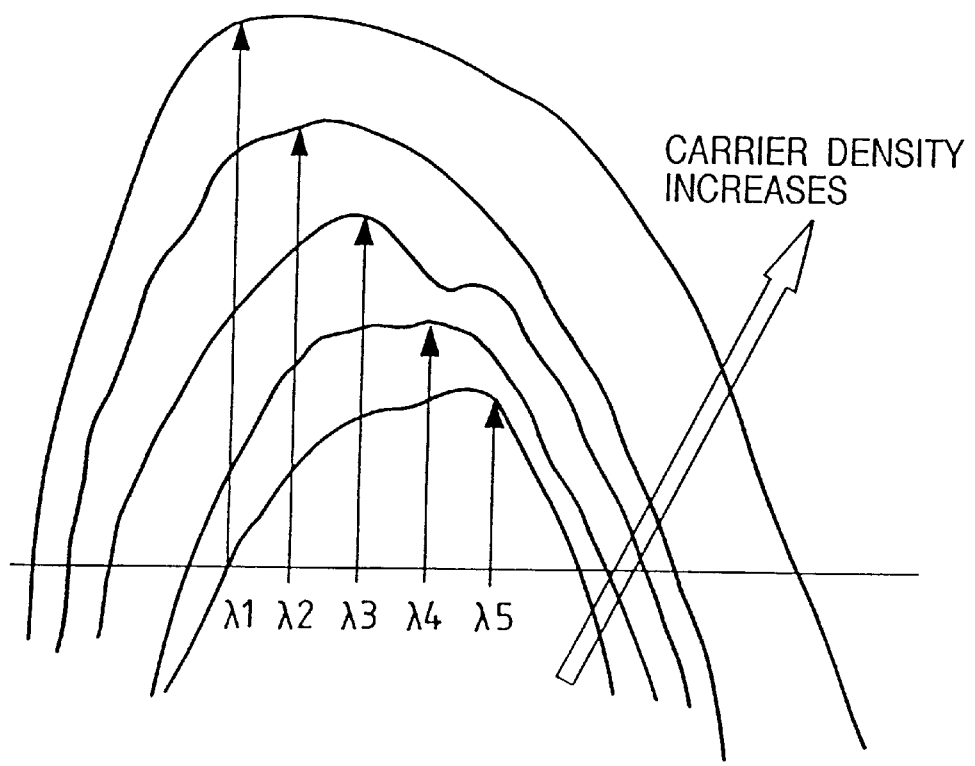
FIG. 48 is a view illustrating a manner of a change of gain profiles for one active layer for explaining the operation of the seventh embodiment of the present invention.

Since the asymmetrical strained quantum well structure is used as the active layer 3203a, its gain spectrum is largely different from that of an ordinary non-strained multiple quantum well active layer. First, since a tensile strain is introduced into each of the well layers 3271 and 3272, a transition between electrons and light holes (the e-lh transition) is dominant and the TM-mode gain always surpasses the TE-mode gain at the peak wavelength. Second, since thicknesses and compositions of the well layers are asymmetrical with each other, a ground level differs between the well layers and the gain spectrum is greatly changed by the amount of carriers injected therein. FIG. 48 schematically illustrates a typical TM-mode gain spectrum of the semiconductor laser array of the seventh embodiment with the density of injected carriers being its parameter. As the amount of injected carriers increases, the magnitude of the peak increases and the peak wavelength position shifts to a shorter wavelength side. Therefore, when the Bragg wavelengths of the semiconductor laser structures in the first semiconductor laser array 3001 are respectively set at positions ($\mu 1, \mu 2, \mu 3, \ldots$) indicated by arrows in FIG. 48 (by setting the pitches of the gratings 3207, for example) and the magnitude of loss is controlled, there can be obtained the TM-mode semiconductor laser array 3001 in which oscillation wavelengths vary from each other, wavelength stability is high and oscillation always occurs in the TM mode. In this embodiment, as a method of controlling the loss, a method of increasing the threshold gain by decreasing the size of the gain region is used (see FIG. 42). In the seventh embodiment, the DBR region is not a pure DBR laser since it includes the active layer 3203a. However, both of the wavelength and the threshold gain can be controlled by controlling the amounts of currents injected into the gain region and the DBR region. In the seventh embodiment, although the above-discussed structure is used since its fabrication can be readily performed, a DBR laser with an ordinary DBR region without any gain can be adopted.

On the other hand, in the TE-mode semiconductor laser array 3002, oscillation occurs in a Fabry-Perot multi-mode since the Fabry-Perot cavity and the bulk active layer 3203a with a wide gain spectrum are used. Therefore, when the wavelength range of the TM-mode DBR laser array is not extremely wide, the oscillation can always occur in the Fabry-Perot mode of the TE polarization whose threshold gain is equal to that of the TM mode of each TM-mode DBR laser. Conditions therefor are more moderate than those in the case of the fifth embodiment. This leads to a wide polarization-modulation operation range. When the wavelength range of the TM-mode DBR laser array is wide, a problem can be coped with by adoption of an asymmetrical compressively-strained quantum well structure or the like as the active layer in the TE-mode Fabry-Perot semiconductor laser array 3002.

For each of the two semiconductor lasers, however, the other cavity is a cause that disturbs the phase. So, there may be a case where it is impossible to effect the oscillation at the Bragg wavelength unless the phase is adjusted. In this case, to adjust the phases (or optical lengths) of competing light waves, the spacing 3208 formed between the two semiconductor laser arrays is filled with the filler, such as gel or polymer, whose refractive index can be controlled. Thus, it is possible to achieve the polarization modulation with good yield. Further, in place of the gel and the polymer, the spacing may be filled with liquid crystal whose refractive index or transmissivity can be varied by applying a voltage across the LC through an electrode formed thereon. Furthermore, after the spacing is formed, semiconductor, such as InP or the like, may be grown epitaxially and then the electrode may be formed. Thus, the phase adjustment can be conducted by varying the amount of carries injected through that electrode.

Technical advantages of the seventh embodiment are as follows:

(1) A multi-wavelength polarization selective semiconductor laser array can be readily achieved;

(2) The cost is relatively low since a laser array with a very simple electrode stripe can be used as the TE-mode laser array, for example;

(3) Even if the phase of light does not match, the adjustment of the phase can be readily performed; and (4) The polarization-modulation operation range is wide.

Eighth Embodiment

Figure 21:
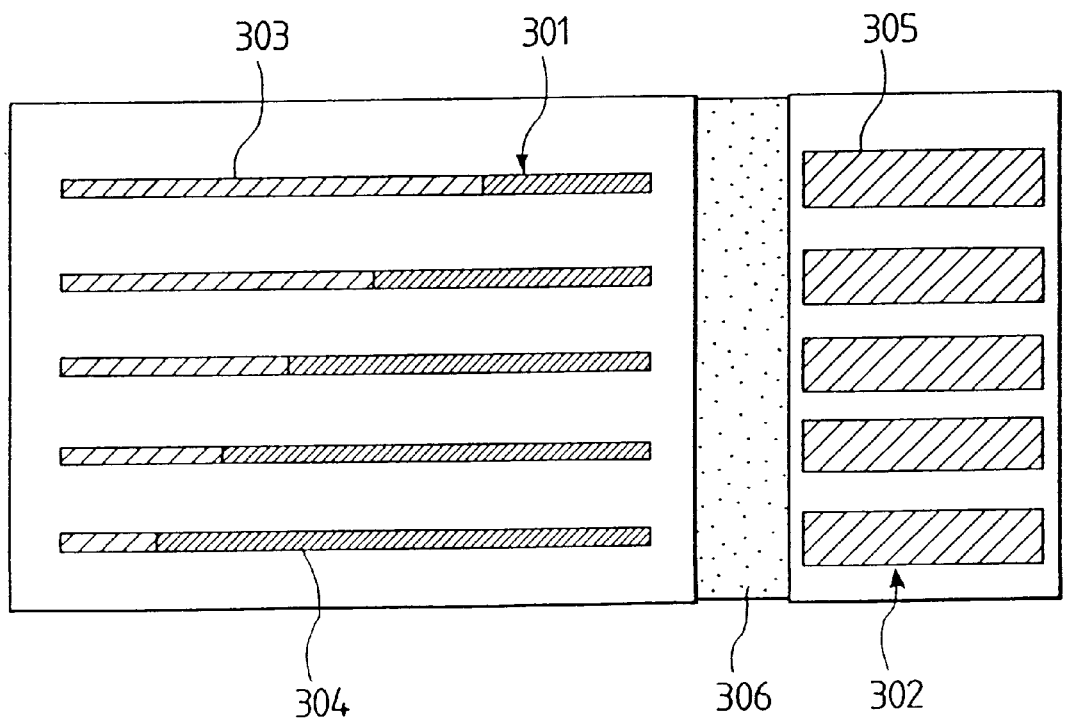
FIG. 21 is a plan view illustrating a semiconductor laser array of an eighth embodiment of the present invention.

An eighth embodiment is directed to a multi-wavelength polarization selective semiconductor laser array in which oscillation wavelengths of respective semiconductor lasers are different from each other. FIG. 21 is its plan view. In FIG. 21, reference numeral 301 denotes a semiconductor laser array for the TM mode, reference numeral 302 denotes a semiconductor laser array for the TE mode, reference numeral 303 denotes a DBR region of each laser in the TM-mode semiconductor laser array 301, reference numeral 304 denotes a TM-mode gain region of each laser in the TM-mode semiconductor laser array 301, reference numeral 305 denotes a TE-mode gain region of each laser in the TE-mode semiconductor laser array 302 and reference numeral 306 denotes a spacing and/or a filler.

The design principle of this embodiment is as follows:

(1) The first semiconductor laser array 301 includes a common active layer, in which the TM-mode gain is dominant, and distributed Bragg reflectors (DBRs) with different Bragg wavelengths;

(2) The second semiconductor laser array 302 includes a common active layer, in which the TE-mode gain is dominant, and Fabry-Perot cavities;

(3) Threshold gains (or cavity losses) of respective lasers in the first semiconductor laser array 301 are controlled by varying sizes of the active region 304 and the DBR regions 303; and (4) Each laser in the second semiconductor laser array 302 has the same structure and a common threshold gain.

Figure 22:
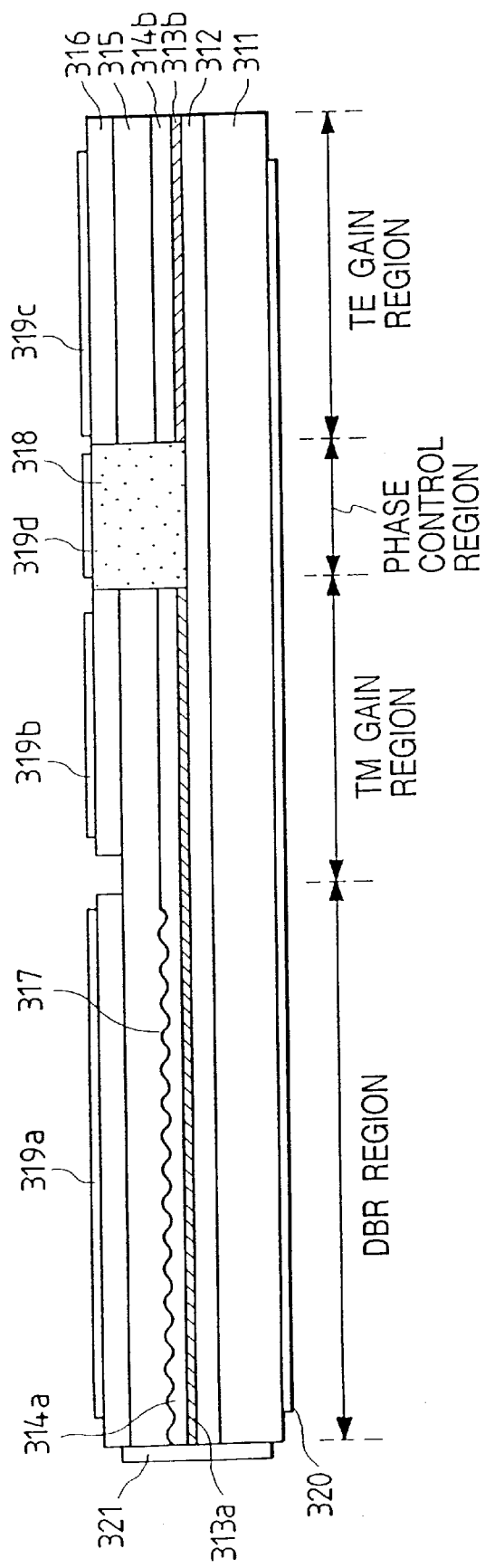
FIG. 22 is a cross-sectional view taken along a cavity direction of a polarization selective semiconductor laser for explaining the eighth embodiment of the present invention.

A fabrication method of the first semiconductor laser array 301 will be initially described. FIG. 22 illustrates cross sections of the first and second semiconductor laser arrays 301 302 including their oscillation axes. A cross section thereof perpendicular to the cross section of FIG. 22 is about the same as that of the third embodiment (see FIG. 14).

Since the fabrication method of the eighth embodiment is similar to that of the third embodiment, it will be described with the aid of FIG. 15. On an n-type (100) InP substrate 311, after an n-type InP clad layer 312 is formed, an undoped active layer 313a and a p-InGaAsP light guide layer 314a are laid down only on a region of the first semiconductor laser array using a selective mask (it corresponds to the selective mask 174a in FIG. 15A). A growth method at this time is appropriately the MOCVD method or the CBE method. Here, abnormal growth is likely to occur near the mask edge portion, but it may be left without any processing.

Figure 23:
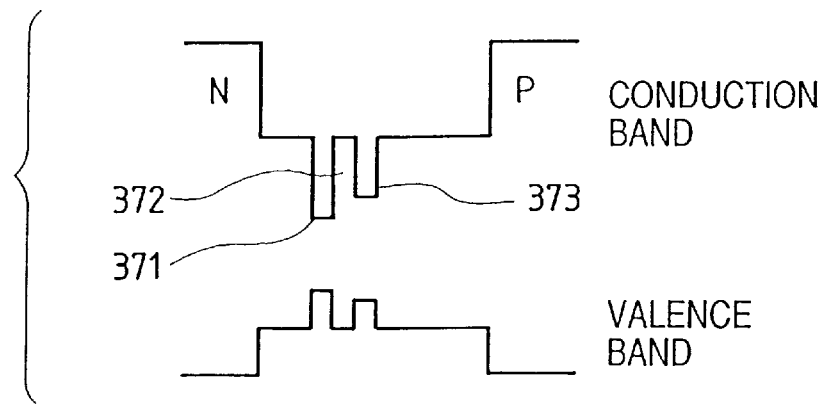
FIG. 23 is a view for explaining the band gap structure of one active layer in the eighth embodiment of the present invention.

FIG. 23 is the band diagram of the active layer 313a. In FIG. 23, reference numeral 371 denotes a tensile strained InGaAs first well layer formed with the amount of a tensile strain of 0.9% and a thickness of 9 nm, reference numeral 372 denotes a non-strained InGaAsP barrier layer formed with a band gap of 0.99 eV and a thickness of 10 nm, and reference numeral 373 denotes a tensile strained InGaAsP second well layer formed with the amount of a tensile strain of 0.7%, a band gap of 0.8 eV and a thickness of 10 nm.

In the fabrication method, ten grating regions with gratings 317 having pitches of 325 nm to 328.6 nm (an interval of 0.4 nm therebetween) with a common depth of 50 nm are formed at intervals of 100 μm along a lateral direction (an up and down direction in FIG. 21) only on a DBR region of the light guide layer 314a. In this embodiment, no grating is formed on the TM-mode gain region while the grating is formed over the entire light guide layer 164a in FIG. 15A. Lengths of the DBR region and the TM-mode gain region in the cavity direction are gradually varied as illustrated in FIG. 21. This is for varying the threshold gains of the respective semiconductor lasers, which will be described later.

Then, the selective mask is removed, and a new selective mask (it corresponds to the selective mask 174b in FIG. 15B) is formed covering the region of the first semiconductor laser array. After that, a second active layer 313b and a second light guide layer 314b are selectively grown on the n-InP clad layer 312 thinly formed as a buffer layer. Also in this case, abnormal growth is likely to appear near the edge, but it may be left as it is. In the structure of the second active layer 313b, it is desirable that the TE-mode is large and its gain spectrum is flat. Here, an undoped InGaAsP layer with a band gap wavelength of 1.53 μm and a thickness of 500 nm is used.

After the selective mask (it corresponds to the selective mask 174b in FIG. 15B) is removed, a p-InP clad layer 315 and a p-InGaAs contact layer 316 are laid down over the entire wafer.

A processing step thereafter is a characteristic portion of this embodiment. A boundary portion between the two semiconductor laser array regions is removed in a slit-like form (see FIG. 15D). Here, the depth of the slit reaches the n-InP clad layer 312, and the slit pattern is formed in a slant form relative to a waveguide direction on the end facet side of the first semiconductor laser array 301 and perpendicularly to the waveguide direction on the end facet side of the second semiconductor laser array 302 (the slant end facet is depicted as a straight line in FIG. 21). This is for preventing reflections at a spacing portion 318 as far as possible for the first semiconductor laser array 301, and for forming the Fabry-Perot cavity for the second semiconductor laser array region. That process can be performed by an ordinary MOCVD method and dry etching, but when that process is continuously carried out without exposing the wafer to the atmosphere in a composite processing apparatus in which the RIBE apparatus is coupled to the CBE apparatus in a high vacuum manner, the reliability can be further improved.

As illustrated in FIG. 21, a plurality of transverse-mode waveguides are formed at intervals of 100 μm, and a plurality of ridge waveguides with a common width of 10 μm are formed in the region of the TM-mode semiconductor laser array. In the second semiconductor laser array 302, an electrode stripe with a width of 10 μm is formed such that all of the lasers have an equal threshold gain. Finally, electrodes 319a–319d and 320 are formed such that carriers can be independently injected into the DBR region, TM-mode gain region, phase control region and TE-mode gain region. Reference numeral 321 denotes an AR coat formed on the end facet of the DBR laser.

Since the asymmetrical strained quantum well structure is used as the active layer 313a, its gain spectrum is largely different from that of an ordinary non-strained multiple quantum well active layer. First, since a tensile strain is introduced into each of the well layers 371 and 373, the transition between electrons and light holes (the e-lh transition) is dominant and the TM-mode gain always surpasses the TE-mode gain at the peak wavelength. Second, since thicknesses and compositions of the well layers are asymmetrical with each other, the ground level differs between the well layers and the gain spectrum greatly changes by the amount of carriers injected therein.

Figure 24:
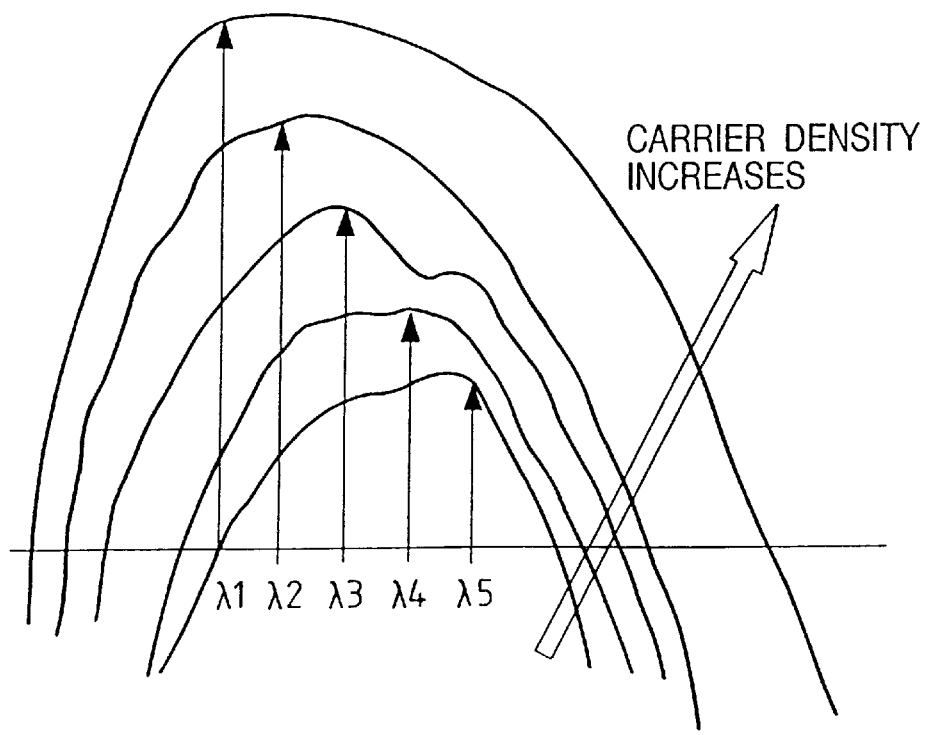
FIG. 24 is a view illustrating a manner of a change of gain profiles for one active layer for explaining the operation of the eighth embodiment of the present invention.

FIG. 24 schematically illustrates a typical TM-mode gain spectrum of the semiconductor laser array of this embodiment with the density of injected carriers being its parameter. As the amount of injected carriers increases, the magnitude of the peak increases and the peak wavelength position shifts to a shorter wavelength side. Therefore, when the Bragg wavelengths of the semiconductor lasers are respectively set at positions ($\mu$1, $\mu$2, $\mu$3, . . . ) indicated by arrows in FIG. 24 (by setting the pitches of the gratings 317, for example) and the magnitude of loss is controlled, there can be obtained the TM-mode semiconductor laser array 301 in which oscillation wavelengths vary from each other, wavelength stability is high and oscillation always occurs in the TM mode. In this embodiment, as a method of controlling the loss, a method of increasing the threshold gain by decreasing the size of the gain region is used (see FIG. 21). In the eighth embodiment, the DBR region is not a pure DBR laser since it includes the active layer 313a. However, both of the wavelength and the threshold gain can be controlled by controlling the amounts of currents injected into the gain region and the DBR region. In the eighth embodiment, although the above-discussed structure is used since its fabrication is easy, a DBR laser with an ordinary DBR region without any gain can be adopted.

On the other hand, in the TE-mode semiconductor laser array 302, oscillation occurs in a Fabry-Perot multi-mode since the Fabry-Perot cavity and the bulk active layer with a wide gain spectrum are used therein. Therefore, when the wavelength range of the TM-mode DBR laser array is not extremely wide, the oscillation can always occur in the Fabry-Perot mode of the TE polarization whose threshold gain is equal to that of the TM mode of each TM-mode DBR laser. Conditions therefor are more moderate than those in the case of the first embodiment. This leads to a wide polarization-modulation operation range. When the wavelength range of the TM-mode DBR laser array 301 is wide, a problem can be coped with by the adoption of an asymmetrical compressively-strained quantum well structure or the like as the active layer in the TE-mode Fabry-Perot semiconductor laser array 302.

For each of the two semiconductor lasers, however, the other cavity is a cause that disturbs the phase. So, there may be a case where it is impossible to effect the oscillation at the Bragg wavelength unless the phase is adjusted. In this case, to adjust the phases (or optical lengths) of competing light waves, the spacing 318 formed between the two semiconductor lasers is filled with the filler, such as gel or polymer, whose refractive index can be controlled. Thus, it is possible to achieve the polarization modulation with good yield. Further, as described above, in place of the gel and the polymer, the spacing may be filled with liquid crystal whose refractive index or transmissivity can be varied by applying a voltage across the LC through an electrode formed thereon. Furthermore, after the spacing is formed, semiconductor, such as InP or the like, may be grown epitaxially and then the electrode may be formed. Thus, the phase adjustment can be conducted by varying the amount of carries injected through that electrode.

Technical advantages of the eighth embodiment are as follows:

(1) The multi-wavelength polarization selective semiconductor laser array can be readily achieved;

(2) The cost is relatively low since a laser array with a very simple electrode stripe can be used as the TE-mode laser, for example;

(3) Even if the phase of light does not match, the adjustment of the phase can be readily performed; and (4) The polarization-modulation operation range is wide.

Ninth Embodiment

Figure 49:
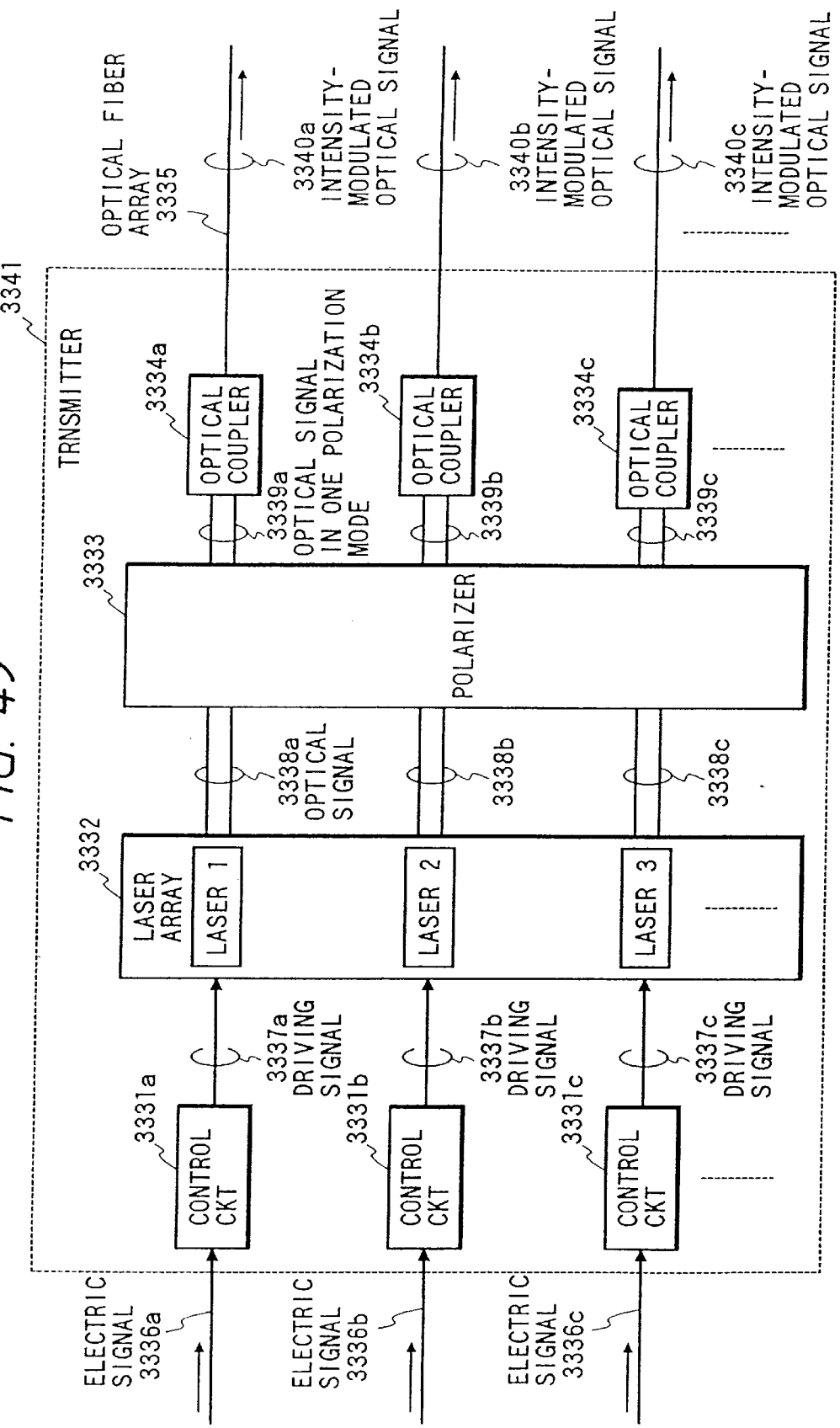
FIG. 49 is a schematic view illustrating a structural example of an optical transmitter using a polarization selective semiconductor laser array of the present invention.

FIG. 49 illustrates a ninth embodiment in which a semiconductor laser array of the present invention is used in an optical transmitter for use in optical communications. In FIG. 49, reference numeral 3331 denotes a control circuit, reference numeral 3332 denotes a semiconductor laser array of the fifth embodiment of this invention, reference numeral 3333 denotes a polarizer, reference numeral 3334 denotes an optical coupling unit for coupling light transmitted in a space to an optical fiber array, reference numeral 3335 denotes an optical fiber array, reference numeral 3336 denotes an electric signal transmitted from a terminal, reference numeral 3337 denotes a driving signal transmitted from the control circuit 3331 to drive the semiconductor laser 3332, reference numeral 3338 denotes an optical signal output by driving the semiconductor laser array 3332 in accordance with the driving signal 3337, reference numeral 3339 denotes an optical signal transmitted through the polarizer 3333 which is adjusted to select only one of two components of the optical signal 3338 in two mutually-perpendicular polarization states, reference numeral 3340 denotes an optical signal transmitted in the optical fiber array 3335, and reference numeral 3341 denotes an optical transmitter using the semiconductor laser array 3332 of the present invention. In this embodiment, the optical transmitter 3341 includes the control circuit 3331, the semiconductor laser array 3332, the polarizer 3333, the optical coupling unit 3334, the optical fiber array 3335 and the like.

The transmission operation of the optical transmitter 3341 of this embodiment will be described. Upon input of the electric signal 3336 from the terminal into the control circuit 3331, the driving signal 3337 is supplied to the semiconductor laser array 3332 of this invention. The semiconductor laser array 3332, into which the driving signal 3337 is input, outputs the optical signal 3338 whose polarization state is modulated in accordance with the driving signal 3337. In this case, actually, respective lasers in the semiconductor laser array 3332 are ordinarily driven by different driving signals 3337a, 3337b, 3337c, . . . , and output different optical signals 3338a, 3338b, 3338c, . . . at the same wavelength, respectively. However, this is simply expressed as the optical signal 3338, when there is no fear that any misunderstanding occurs. That optical signal 3338 is changed to the optical signal 3339 in one polarization mode by the polarizer 3333, and the optical signal 3339 is coupled to the optical fiber array 3335 by the optical coupling unit 3334. Thus, the intensity-modulated optical signal 3340 is transmitted and the communication is achieved. In this case, since the optical signal 3340 is in an intensity-modulated state, transmitted light can be received by an optical receiver which is conventionally used for intensity modulation.

Tenth Embodiment

Figure 25:
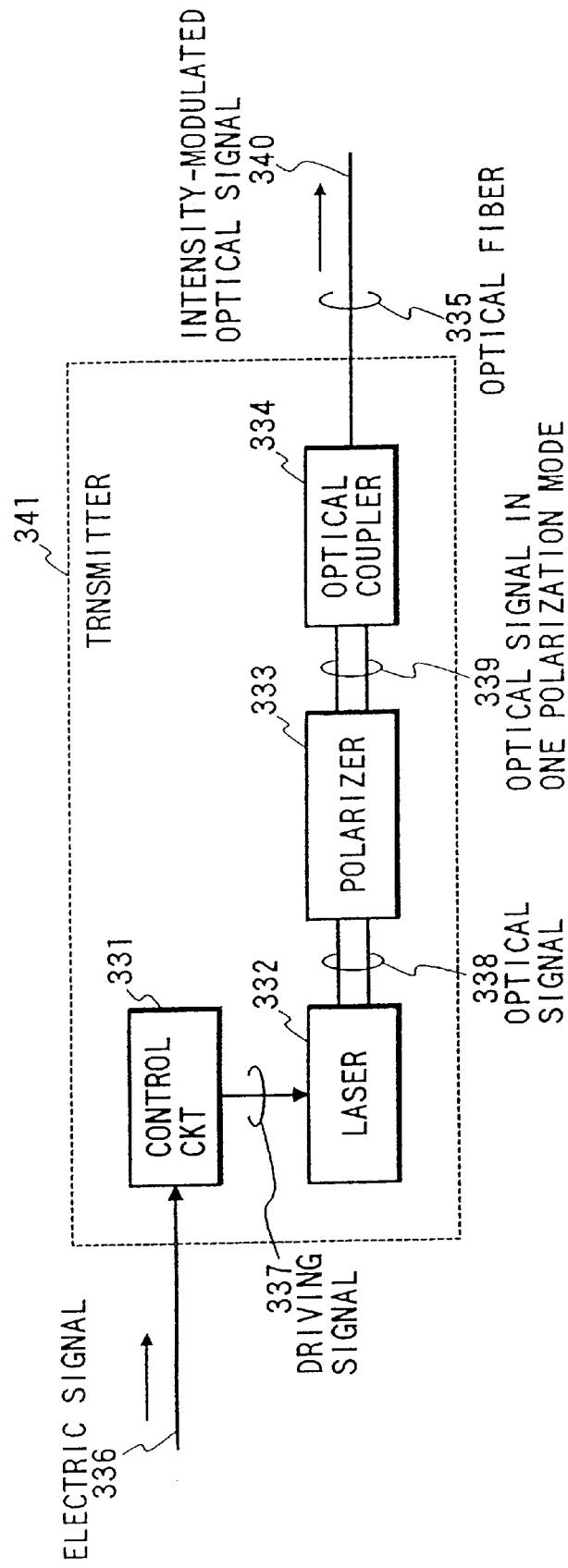
FIG. 25 is a schematic diagram illustrating a structural example of an optical transmitter of the present invention used in systems of FIGS. 27 and 28.

FIG. 25 illustrates a tenth embodiment in which a semiconductor laser of the present invention is used in an optical transmitter for use in optical communications. In FIG. 25, reference numeral 331 denotes a control circuit, reference numeral 332 denotes a semiconductor laser of the present invention, reference numeral 333 denotes a polarizer, reference numeral 334 denotes an optical coupling unit for coupling light transmitted in a space to an optical fiber, reference numeral 335 denotes an optical fiber, reference numeral 336 denotes an electric signal transmitted from a terminal, reference numeral 337 denotes a driving signal transmitted from the control circuit 331 to drive the semiconductor laser 332, reference numeral 338 denotes an optical signal output by driving the semiconductor laser 332 in accordance with the driving signal 337, reference numeral 339 denotes an optical signal transmitted through the polarizer 333 which is adjusted to select only one of two components of the optical signal 338 in two mutually-perpendicular polarization states, reference numeral 340 denotes an optical signal transmitted in the optical fiber 335, and reference numeral 341 denotes an optical transmitter using the semiconductor laser 332 of the present invention. In this embodiment, the optical transmitter 341 includes the control circuit 331, the semiconductor laser 332, the polarizer 333, the optical coupling unit 334, the optical fiber 335 and the like.

The transmission operation of the optical transmitter 341 of this embodiment will be described. Upon input of the electric signal 336 from the terminal into the control circuit 331, the driving signal 337 is supplied to the semiconductor laser 332 of this invention. The semiconductor laser 332, into which the driving signal 337 is input, outputs the optical signal 338 whose polarization state is modulated in accordance with the driving signal 337. That optical signal 338 is changed to the optical signal 339 in one polarization mode by the polarizer 333, and the optical signal 339 is coupled to the optical fiber 335 by the optical coupling unit 334. Thus, the intensity-modulated optical signal 340 is transmitted and the communication is achieved. In this case, since the optical signal 340 is in an intensity-modulated state, transmitted light can be received by an optical receiver which is conventionally used for intensity modulation. When the semiconductor laser used in this embodiment is a wavelength tunable semiconductor laser, the transmitter of this embodiment can be used for wavelength division multiplexing communications.

Eleventh Embodiment

Figure 26:
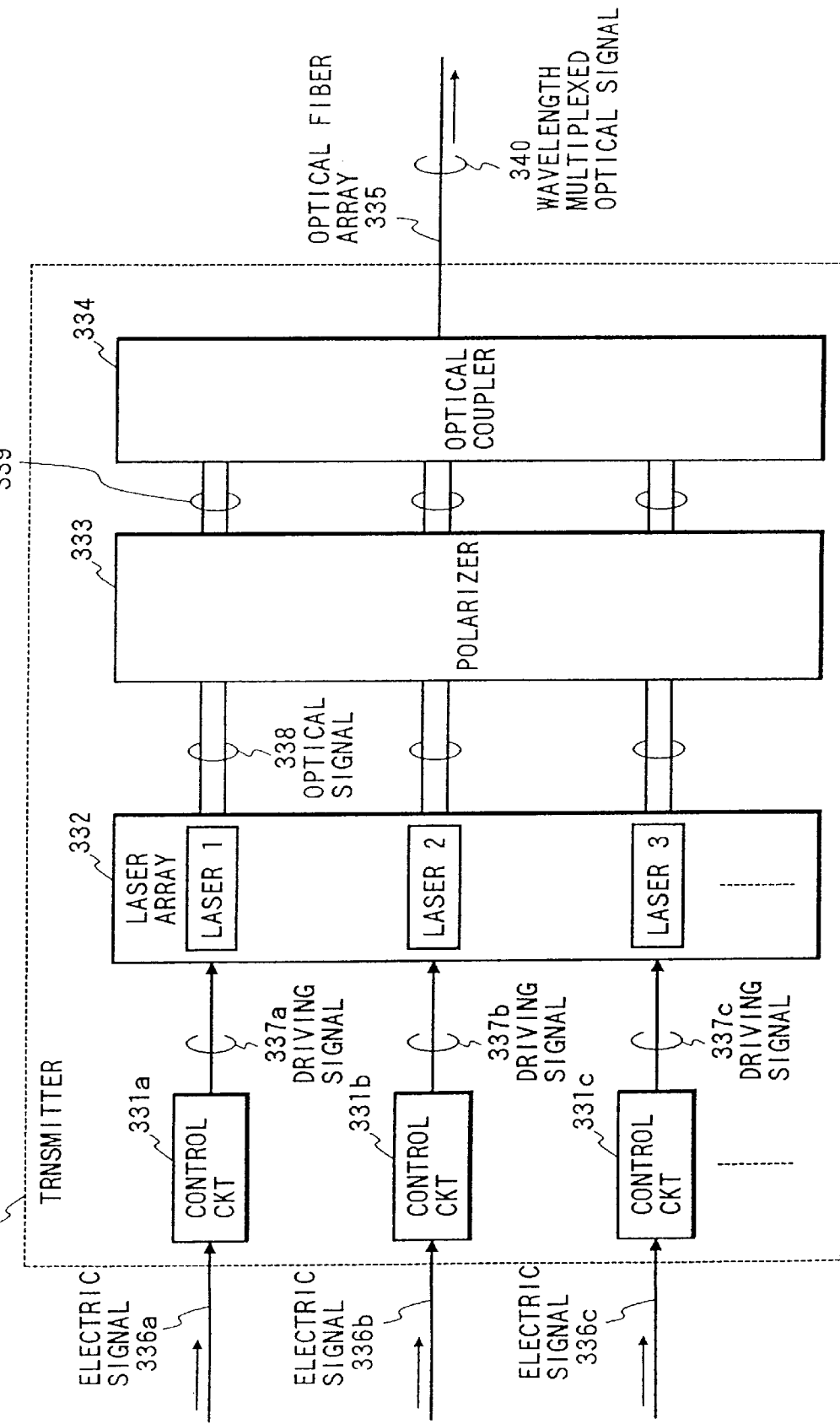
FIG. 26 is a schematic diagram illustrating a structural example of an optical transmitter using a polarization selective semiconductor laser array of the present invention used in systems of FIGS. 27 and 28.

FIG. 26 illustrates an eleventh embodiment in which a semiconductor laser array of the present invention is used in an optical transmitter for use in optical communications. This embodiment is different from the ninth embodiment in that oscillation wavelength of respective semiconductor lasers of the semiconductor laser array vary from each other and hence the wavelength multiplexing transmission is conducted. Other functions of this embodiment are the same as those of the ninth embodiment. In FIG. 26, reference numeral 332 denotes a semiconductor laser array of this invention, and oscillation wavelengths of the respective semiconductor lasers are different from each other. The polarizer need not be arranged for the respective lasers since the polarization planes thereof are aligned with each other. Further, the optical coupling unit 334 can be readily constructed by a waveguide type combiner.

Twelfth Embodiment

Figure 27:
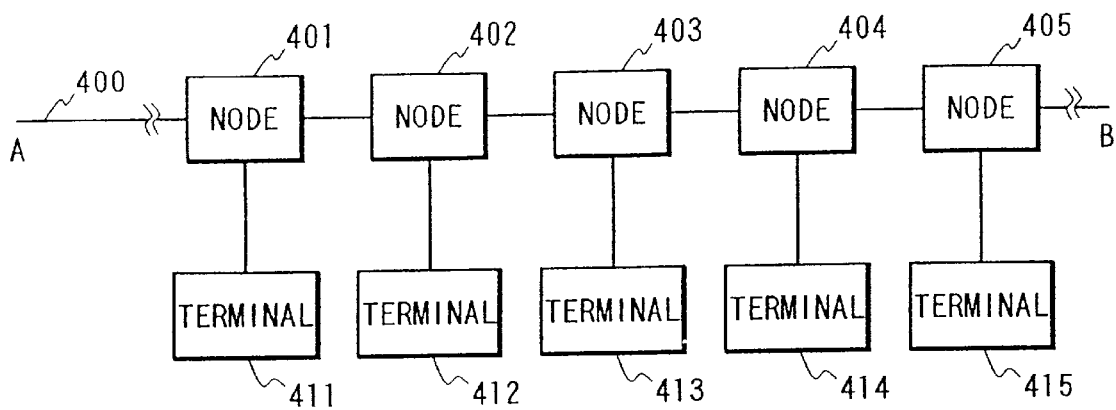
FIG. 27 is a schematic view illustrating a structural example of a bus-type optical LAN system using a semiconductor device of the present invention.
Figure 28:
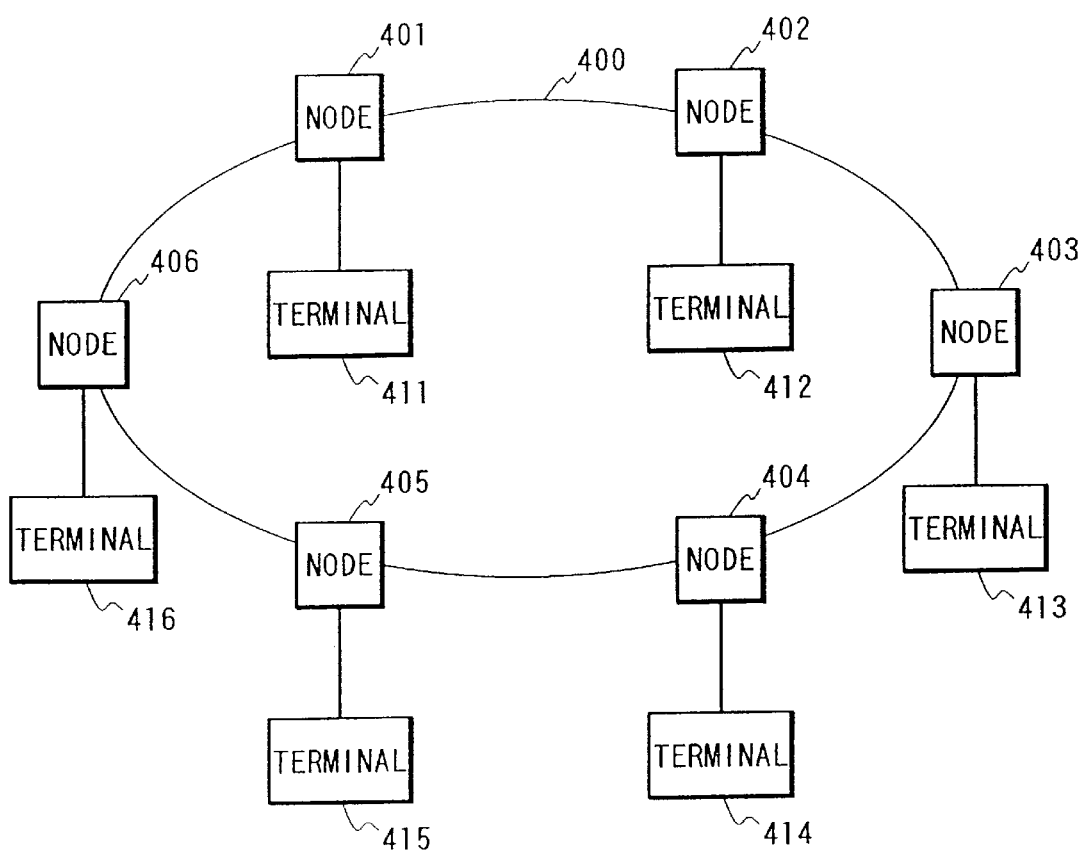
FIG. 28 is a schematic view illustrating a structural example of a loop-type optical LAN system using a semiconductor device of the present invention.

A twelfth embodiment is directed to an optical network using a device of this invention. FIGS. 27 and 28 are respectively bus-type and loop-type optical networks, and an optical transmitter including the embodiment of this invention and an appropriate receiver are arranged in each of optical nodes 401 to 406. A polarizer is disposed in front of the emission end face of a semiconductor laser of the present invention to select only light in a predetermined polarization mode (for example, TM-mode light) and transmit it to a transmission line 400. Further, when two receivers are arranged, signal light is divided into two portions to be input into the two receivers and one is received as the TE mode while the other is received as the TM mode, polarization diversity can be readily achieved. Reference numerals 411 to 416 respectively designate terminal equipments.

When a semiconductor laser of the present invention without any polarizer is used, the network can have multiple functions since light in different polarization modes can be simultaneously transmitted. For example, in a wavelength multiplexing system using a wavelength tunable laser and a wavelength tunable filter, a light source for the polarization diversity can be constructed with a very simple structure when the wavelength tunable filter is caused to have polarization dependency.

The foregoing is described using devices of 1.5 μm band, but the same holds true in a case of devices of other wavelength bands and materials. In this embodiment, the structure is described as an optical transmitter, but the structure may be used in a transmitter portion of an optical transceiver. Further, the structure can be used not only in a simple optical communication between two points but in optical CATV, optical LAN or the like so long as such a system handles the intensity-modulated signal.

Thirteenth Embodiment

Figure 29:
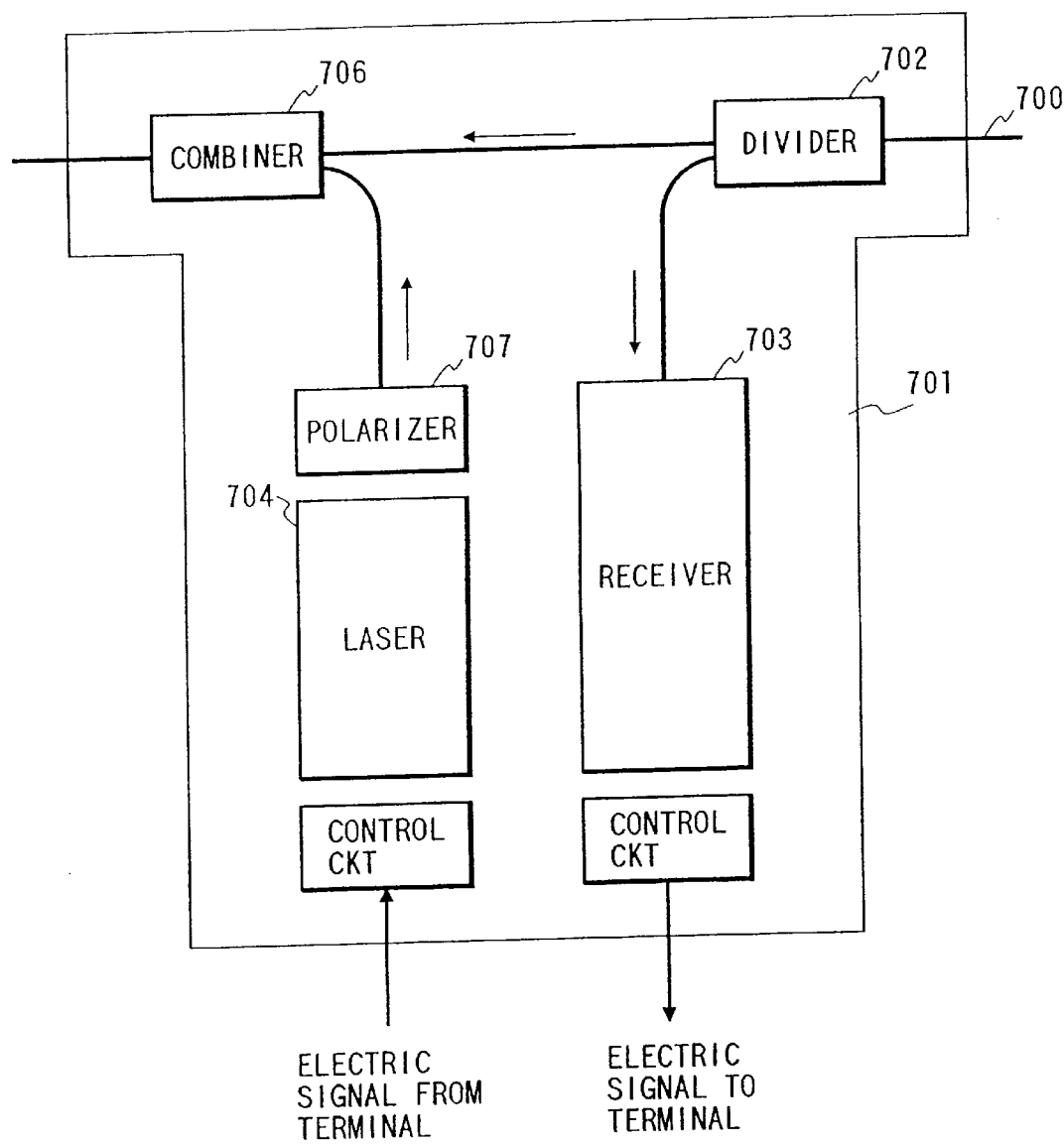
FIG. 29 is a schematic view illustrating a structural example of an optical transceiver of the present invention used in systems of FIGS. 27 and 28.
Figure 30:
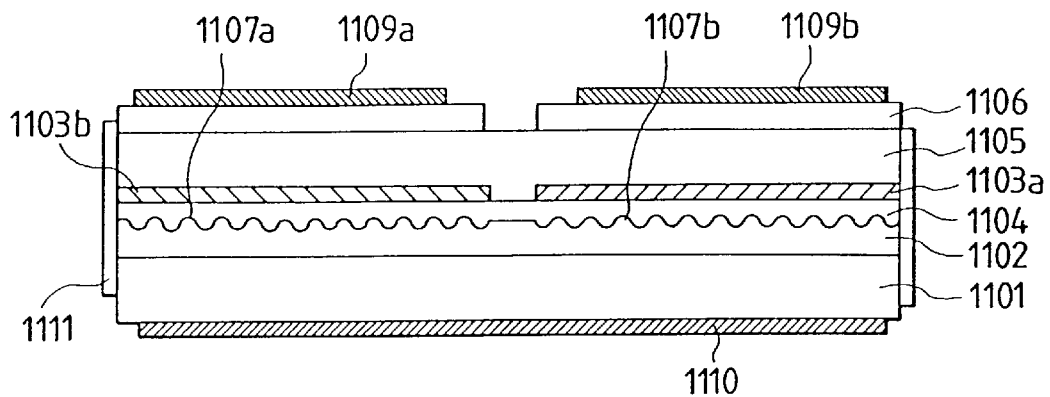
FIG. 30 is a cross-sectional view in a cavity direction of a conventional device.
Figure 31:
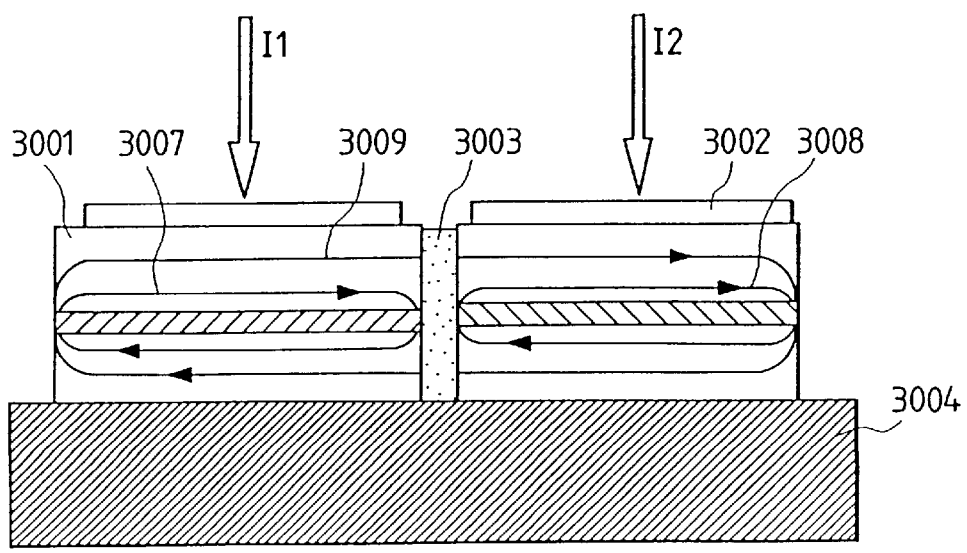
FIG. 31 is a cross-sectional view for explaining the principle of the present invention using its typical example.

A thirteenth embodiment is directed to an optical transceiver in which the embodiment of this invention is used in its transmitter portion. As illustrated in FIG. 29, an optical signal is taken in a node 701 through an externally-connected optical fiber 700, and a portion of the signal is input through a divider 702 into a receiver 703 provided with a wavelength tunable optical filter and the like. The received signal is properly processed by a control circuit and the processed one is sent to the terminal. On the other hand, when an optical signal is to be transmitted from the node 701, a polarization selective semiconductor laser 704 of the present invention is properly driven by a control circuit in accordance with a signal and its polarization mode is modulated, as described above. The modulated light is transmitted through a polarizer 707 and converted into an intensity-modulated signal (the light may also be transmitted through an isolator). The intensity-modulated signal is sent to the light transmission line 700 through a combiner 706. Further, a plurality of semiconductor lasers and wavelength tunable optical filters may be arranged to widen the wavelength changeable range.

The following technical advantages can be attained by the present invention, as described in the above-discussed embodiments.

(1) The TE-mode and TM-mode semiconductor laser structures can be designed substantially independently, so that the apparatus can be readily optimized.

(2) Burdens in connection with processing can be lightened, so that yield can be improved.

(3) Reflection prevention, coupling efficiency and phase can be readily adjusted or controlled by using the spacing formed between the TE-mode and TM-mode semiconductor laser structures.

(4) When one semiconductor laser structure is actively operated and the position of the other laser is appropriately aligned, their packaging work can be performed while the optical coupling state between the two semiconductor laser structures are being confirmed. Thus, the alignment between the two semiconductor laser structures can be stably achieved with high precision for each packaging work. Here, when one semiconductor laser structure is a Fabry-Perot semiconductor laser structure with a wide stripe electrode, the alignment can be further facilitated.

(5) When the positional alignment is performed using the structure of a member to which two semiconductor laser structures are mounted, there is no need to drive the semiconductor laser structure and the alignment between the two semiconductor laser structures can be more readily achieved.

(6) When the refractive index of material filling the spacing between end facets of TE-mode and TM-mode semiconductor laser structures can be electrically controlled, the coupling between the two modes can be actively controlled. Therefore, it can be considered to perform the switching between the polarization modes by that electric control.

Furthermore, the following technical effects can be obtained: the polarization-modulation operation range is wide; the phase matching can be readily executed even if the phase does not match; yield is excellent even when the selective growth is employed;

and a multi-wavelength polarization selective laser array can be readily fabricated.

Further, it is possible to readily obtain an intensity-modulated optical output with a high extinction ratio by selecting one polarization mode of the polarization-modulated light output using the polarizer or the like. In some constructions, the polarizer can also be used as the isolator and thus the construction can be simplified. Further, in optical transmission systems or wavelength division multiplexing systems including the transmitter or transceiver using the semiconductor laser of the present invention, high-speed, large-capacity and super-large-density optical transmission systems capable of wavelength multiplexing can be built at a relatively low cost.

What is claimed is:

1. A method of fabricating a semiconductor laser capable of switching a polarization mode of output light, said method comprising the steps of:

fabricating a first semiconductor laser structure, a gain for a first polarization mode being larger than a gain for a second polarization mode in the first semiconductor laser structure; and fabricating a second semiconductor laser structure independently from said fabricating step of the first semiconductor laser structure, a gain for the second polarization mode being larger than a gain for the first polarization mode in the second semiconductor laser structure; and arranging the first semiconductor laser structure and the second semiconductor laser structure along a waveguide direction on a common support member such that the first and second semiconductor laser structures-are optically coupled to each other.

2. A method according to claim 1, wherein said arranging step includes a step, in which one of the first semiconductor laser structure and the second semiconductor laser structure is caused to emit light after the first semiconductor laser structure is positioned on the support member, and the other of the first semiconductor laser structure and the second semiconductor laser structure is caused to receive the light output from the one of the first semiconductor laser structure and the second semiconductor laser structure, as a photodetector, and is positioned.

3. A method according to claim 1, wherein said arranging step includes a step in which the semiconductor laser structure and the support member are brought into a desired positional relationship and the semiconductor laser structure is positioned, using a marker provided on at least one of the semiconductor laser structure and the support member.

4. A method according to claim 1, wherein said arranging step includes a step in which the semiconductor laser structure is abutted against a abutment portion of the support member and is positioned.

5. A method according to claim 1, wherein in said arranging step the first semiconductor laser structure and the second semiconductor laser structure are arranged with a spacing therebetween.

6. A method according to claim 5, further comprising a step of filling the spacing with a filler.

7. A method of fabricating a semiconductor laser capable of switching a polarization mode of output light, said method comprising the steps of:

fabricating at least a portion of a first semiconductor laser structure on a substrate, a gain for a first polarization mode being larger than a gain for a second polarization mode in the first semiconductor laser structure;

fabricating at least a portion of a second semiconductor laser structure on the substrate, a gain for the second polarization mode being larger than a gain for the first polarization mode in the second semi-conductor laser structure; and removing at least one of a portion of the first semiconductor laser structure on the side of the second semiconductor laser structure and a portion of the second semiconductor laser structure on the side of the first semiconductor laser structure to form a spacing between the first semiconductor laser structure and the second semiconductor laser structure, wherein the first semiconductor laser structure and the second semiconductor laser structure are optically coupled to each other.

8. A method according to claim 7, wherein a portion of the first semiconductor laser structure and a portion of the second semiconductor laser structure are simultaneously fabricated.

9. A method according to claim 7, further comprising a step of filling the spacing with a filler.

10. A method of fabricating a semiconductor laser capable of switching a polarization mode of output light, said method comprising the steps of:

fabricating a first semiconductor laser array, the first semiconductor laser array including a plurality of first semiconductor laser structures arranged in a parallel manner, and a gain for a first polarization mode being larger than a gain for a second polarization mode in each of the first semiconductor laser structures;

fabricating a second semiconductor laser array independently from said fabricating step of the first semiconductor laser array, the second semiconductor laser array including a plurality of second semiconductor laser structures arranged in a parallel manner, and a gain for the second polarization mode being larger than a gain for the first polarization mode in each of the second semiconductor laser structures; and arranging the first semiconductor laser array and the second semiconductor laser array along a waveguide direction on a common support member such that the first semiconductor laser structure and the second semiconductor laser structure, corresponding to each other, are optically coupled to each other.

11. A method of fabricating a semiconductor laser capable of switching a polarization mode of output light, said method comprising the steps of:

fabricating a plurality of at least portions of first semiconductor laser structures on a substrate in parallel manner, a gain for a first polarization mode being larger than a gain for a second polarization mode in the first semiconductor laser structure;

fabricating a plurality of at least portions of second semiconductor laser structures on the substrate in a parallel manner, a gain for the second polarization mode being larger than a gain for the first polarization mode in the second semiconductor laser structure; and removing at least one of portions of the first semiconductor laser structures on the side of the second semiconductor laser array and portions of the second semiconductor laser structures on the side of the first semiconductor laser array to form a spacing between the first semiconductor laser structure and the second semiconductor laser structure, corresponding to each other, wherein the first semiconductor laser structure and the second semiconductor laser structure, corresponding to each other, are optically coupled to each other.

* * * * *

UNITED STATES PATENT AND TRADEMARK OFFICE
CERTIFICATE OF CORRECTION

PATENT NO. : 6,043,104
DATED : March 28, 2000
INVENTOR(S) : MAMORU UCHIDA, ET AL.

Page 1 of 3

It is certified that error appears in the above-identified patent and that said Letters Patent is hereby corrected as shown below:

```
COLUMN 1:
   Line 32, "there;is" should read --there is--.

COLUMN 4:
   Line 54, "thershold" should read --threshold--; and
   Line 58, "thershold" should read --threshold--.

COLUMN 7:
   Line 40, "a" should read --an--.

COLUMN 8:
   Line 26, "light;guide" should read --light guide--.

COLUMN 9:
   Line 18, "moudlation" should read --modulation--.

COLUMN 13:
   Line 13, "the" should be deleted; and
   Line 38, "the" should be deleted.
```

UNITED STATES PATENT AND TRADEMARK OFFICE
CERTIFICATE OF CORRECTION

PATENT NO. : 6,043,104

DATED : March 28, 2000

INVENTOR(S) : MAMORU UCHIDA, ET AL.

It is certified that error appears in the above-identified patent and that said Letters Patent is hereby corrected as shown below:

COLUMN 15:
  Line 38, "not" should be deleted.

COLUMN 18:
  Line 34, "carries" should read --carriers--.

COLUMN 21:
  Line 6, "nates;a" should read --nates a--.

COLUMN 25:
  Line 57, "with;an" should read --with an--.

COLUMN 26:
  Line 63, "however,-since" should read --however, since--.

COLUMN 28:
  Line 7, "may;be" should read --may be--.

UNITED STATES PATENT AND TRADEMARK OFFICE
CERTIFICATE OF CORRECTION

PATENT NO. : 6,043,104
DATED : March 28, 2000
INVENTOR(S) : MAMORU UCHIDA, ET AL.

It is certified that error appears in the above-identified patent and that said Letters Patent is hereby corrected as shown below:

COLUMN 30:
  Line 3, "carries" should read --carriers--; and
  Line 50, "301" should read --301,--.

COLUMN 32:
  Line 67, "carries" should read --carriers--.

COLUMN 36:
  Line 23, "s witching" should read --switching--;
  Line 63, "structures-are" should read --structures are--.

COLUMN 37:
  Line 15, "a" should read --an--.

Signed and Sealed this

Twenty-second Day of May, 2001

*Attest:*

NICHOLAS P. GODICI

*Attesting Officer*  *Acting Director of the United States Patent and Trademark Office*